United States Patent
Tobita

(10) Patent No.: US 7,030,682 B2
(45) Date of Patent: Apr. 18, 2006

(54) VOLTAGE DETECTION CIRCUIT AND INTERNAL VOLTAGE GENERATING CIRCUIT COMPRISING IT

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/489,106

(22) PCT Filed: Sep. 11, 2002

(86) PCT No.: PCT/JP02/09301

§ 371 (c)(1),
(2), (4) Date: Mar. 10, 2004

(87) PCT Pub. No.: WO2004/025817

PCT Pub. Date: Mar. 25, 2004

(65) Prior Publication Data

US 2004/0257148 A1    Dec. 23, 2004

(51) Int. Cl.
*G05F 1/10* (2006.01)
(52) U.S. Cl. .................................................. 327/536
(58) Field of Classification Search ................ 327/50, 327/58, 59, 72, 74, 97, 143, 536
See application file for complete search history.

(56) References Cited

U.S. PATENT DOCUMENTS

| | | | | |
|---|---|---|---|---|
| 4,309,627 A * | 1/1982 | Tabata | ........................ | 327/81 |
| 4,933,827 A | 6/1990 | Olivo et al. | | |
| 4,964,082 A | 10/1990 | Sato et al. | | |
| 5,268,595 A | 12/1993 | Ohshima | | |
| 5,440,254 A * | 8/1995 | Sundby | ........................ | 327/79 |
| 5,530,640 A * | 6/1996 | Hara et al. | .................... | 363/60 |
| 5,561,385 A | 10/1996 | Choi | | |
| 5,814,981 A | 9/1998 | Tsuchi et al. | | |
| 5,886,567 A | 3/1999 | Park et al. | | |
| 5,923,211 A * | 7/1999 | Maley et al. | ................ | 327/540 |
| 6,281,724 B1 * | 8/2001 | Ellis | ........................... | 327/143 |
| 6,333,670 B1 | 12/2001 | Kono et al. | | |
| 2002/0024380 A1 | 2/2002 | Kono | | |

FOREIGN PATENT DOCUMENTS

| | | |
|---|---|---|
| JP | 61-59688 | 3/1986 |
| JP | 5-342868 | 12/1993 |

(Continued)

*Primary Examiner*—Jeffrey Zweizig
(74) *Attorney, Agent, or Firm*—McDermott Will & Emery LLP

(57) ABSTRACT

An internal voltage generation circuit and a voltage detection circuit for stably generating an internal voltage at a desired voltage level are provided. The voltage detection circuit includes an insulated gate field effect transistor receiving a reference voltage at a gate thereof and a voltage dropping element group connected in series between the insulated gate field effect transistor and an internal node. The reference voltage is generated by resistance-dividing a power supply voltage including a voltage drop and a threshold voltage of the insulated gate field effect transistor as its voltage components. When a voltage difference between the reference voltage and the internal voltage attains at least a prescribed value, a current flows through the voltage dropping element group and the insulated gate field effect transistor, and a voltage of a detection node decreases, and a lowering in the internal voltage is detected. The reference voltage includes, as its component, the threshold voltage of the transistor and the voltage drop across the voltage dropping element group, and the variation in these parameters is cancelled to set the resistance-division node at a desired voltage level.

18 Claims, 19 Drawing Sheets

FOREIGN PATENT DOCUMENTS

| | | |
|---|---|---|
| JP | 10-239357 | 9/1998 |
| JP | 2000-163970 | 6/2000 |
| KR | 10-228628 | 11/1999 |
| TW | 459376 | 10/2001 |

* cited by examiner

: CORRESPONDING TO FIG. 13

: CORRESPONDING TO FIG. 16

: CORRESPONDING TO FIG. 18

VOLTAGE DETECTION CIRCUIT AND INTERNAL VOLTAGE GENERATING CIRCUIT COMPRISING IT

TECHNICAL FIELD

The present invention relates to a voltage detection circuit for detecting whether a voltage of interest reaches a prescribed voltage level and to an internal voltage generation circuit utilizing the same. More particularly, the present invention relates to a voltage detection circuit utilizing an insulated gate field effect transistor as a voltage detecting element and to an internal voltage generation circuit utilizing the same. More specifically, the present invention relates to a voltage detection circuit capable of setting a detection voltage level at a desired voltage level and also accurately detecting the voltage level without being influenced by a threshold voltage of a detecting insulated gate field effect transistor, and to an internal voltage generation circuit utilizing the same.

BACKGROUND ART

In many cases, semiconductor circuit devices utilizes internal voltages different in voltage level from a power supply voltage and the ground voltage. Such internal voltages include a boosted voltage higher than the power supply voltage and a negative voltage lower than the ground voltage. In a DRAM (Dynamic Random Access Memory), generally the boosted voltage is used to drive a selected word line, while the negative voltage is used to bias a substrate of a memory array to stabilize a threshold voltage of a memory cell transistor and reduce a parasitic capacitance. In the DRAM, the negative voltage is utilized, in some cases, to maintain a non-selected word line at a non-selected state.

In a non-volatile memory such as a flash memory, the boosted voltage and the negative voltage are utilized to program/erase data. Memory transistors according to different write/erase schemes receives at different nodes the boosted voltage and the negative voltage.

The boosted voltage and the negative voltage are also utilized to drive the gate of a pixel transistor in a liquid crystal display unit.

These internal voltages are generated within a semiconductor circuit device to reduce the number of pin terminals and current consumption in the entire system. As a circuit for producing such internal voltage, generally a charge pump circuit utilizing a charge pump operation of a capacitor is widely employed.

FIG. 1 shows an example of the configuration of a conventional internal voltage generation circuit for producing a negative voltage. In FIG. 1, the internal voltage generation circuit includes a charge pump circuit 100 utilizing a charge pump operation of a capacitive element to generate the negative voltage when active, a voltage detection circuit 102 for detecting a voltage level of an output node 9 of charge pump circuit 100 and producing a signal indicating a result of detection, and a charge pump control circuit 101 for selectively activating charge pump circuit 100 in accordance with the output signal from voltage detection circuit 102.

The charge pump circuit typically includes at least one capacitive element for charge pumping and at least two uni-directional elements (rectifying elements). At least two uni-directional elements each have a rectifying function and supply charge only in one direction. These at least two uni-directional elements are required to draw charge from the output node and precharge an internal node for charge accumulation.

In FIG. 1, charge pump circuit 100 includes a capacitive element 5 connected between nodes 4 and 8, an N channel MOS transistor (insulated gate field effect transistor) 6 connected between node 8 and the ground node and having its gate connected to node 8, and an N channel MOS transistor 7 connected between node 8 and an output node 9 and having its gate connected to output node 9. MOS transistors 6 and 7 each have the gate and drain connected together and operate as a diode (uni-directional element).

Voltage detection circuit 102 includes a resistance element 13 of high resistance connected between a power supply node 2 and a node 14, and N channel MOS transistors 10 and 12 connected in series between node 14 and output node 9 of charge pump circuit 100. MOS transistor 10 has its one conduction node (source) connected to output node 9 of charge pump circuit 100 and its gate and drain connected to a node 11. MOS transistor 12 has its source connected to node 11, its drain connected to node 14, and its gate connected to the ground node.

Charge pump control circuit 101 includes a two-input AND circuit 3 receiving a repetition signal (pump clock signal) $\phi$ applied to a clock node 1 and a signal from node 14 of voltage detection circuit 102. AND circuit 3 applies the charge pumping clock signal (repetition signal) via node 4 to charge pump circuit 100.

FIG. 2 is a signal waveform diagram representing an operation of the internal voltage generation circuit shown in FIG. 1. The operation of the internal voltage generation circuit shown in FIG. 1 will now be described with reference to FIG. 2. It is assumed here that MOS transistors 6, 7, 10, and 12 each have a threshold voltage, VTN. When a potential of node 14 is at a logically high (H) level, that is, when at least one of MOS transistors 10 and 12 is off, AND circuit 3 in charge pump control circuit 101 operates as a buffer circuit and transmits repetition signal $\phi$ applied to clock node 1 to node 4.

In accordance with the repetition signal applied to node 4, capacitive element 5 performs the charge pump operation and changes the potential of node 8. Specifically, when repetition signal $\phi$ rises to the H level, the charge pump operation of capacitive element 5 increases the voltage level of node 8. When the voltage level of node 8 increases, MOS transistor 6 conducts to clamp the voltage level of node 8 at its threshold voltage VTN level. At this stage, the voltage level of output node 9 is not higher than the ground voltage level, and MOS transistor 7 is kept off.

When repetition signal $\phi$ falls down to the L level, the charge pump operation of capacitive element 5 decreases the voltage level of node 8. When an amplitude of the voltage at node 4, determined by repetition signal $\phi$, is VDD, the voltage level of node 8 is lowered to the voltage level of VTN−VDD. In this state, MOS transistor 6 is off. In contrast, MOS transistor 7 conducts when output node 9 is at a voltage level not lower than 2·VTN−VDD. Responsively, positive charges are supplied from output node 9 to node 8, and the voltage level of output node 9 decreases.

By repeating the above-described operation, positive charges are drawn from output node 9, whereby the voltage level of output node 9 decreases. Charge pump circuit 100 is capable of generating a voltage V9, as expressed below, at output node 9.

$$V9 = -VDD + 2 \cdot VTN \tag{1}$$

As for voltage detection circuit 102, when the difference between voltage V9 of node 9 and the voltage of node 11 is VTN or more, MOS transistor 10 conducts. In addition, MOS transistor 12 receives the ground voltage at its gate, and conducts when the voltage level of node 11 is not higher than −VTN. Therefore, when the voltage from charge pump circuit 100 attains the level of −2·VTN, MOS transistors 10 and 12 conduct, and accordingly the voltage level of node 14 decreases. Specifically, both MOS transistors 10 and 12 in voltage detection circuit 102 conduct when the following voltage condition is satisfied.

$$V9 = VG12 - VTN12 - VTN10 \quad (2)$$
$$= 0 - VTN - VTN$$
$$= -2 \cdot VTN$$

Here, VG12 represents a gate voltage of MOS transistor 12. VTN10 and VTN12 are threshold voltages of MOS transistors 10 and 12, respectively, and they are equal to voltage VTN.

When on-resistances (channel resistances) of MOS transistors 10 and 12 are set to be sufficiently smaller than a resistance value of resistance element 13 of high resistance, the voltage level of node 14 attains L level if both MOS transistors 10 and 12 conduct. As a result, the output signal from AND circuit 3 in charge pump control circuit 101 is fixed at the L level, and the pump operation of charge pump circuit 100 halts. Therefore, voltage V9 of output node 9 of charge pump circuit 100 is maintained at −2·VTN.

As shown in FIG. 1, by employing MOS transistors 10 and 12 as voltage level detecting elements in voltage detection circuit 102, charge pump circuit 100 can selectively be activated in accordance with the voltage level of output node 9 of charge pump circuit 100, and internal voltage V9, at a level according to a voltage level detected by voltage level detection circuit 102, can be generated.

As represented in the above expression (2), however, the detected voltage level of voltage V9 from output node 9 is −2·VTN, and is determined by the threshold voltages of the MOS transistors. Therefore, if the threshold voltages of MOS transistors 10 and 12 vary, the variation in threshold voltage of MOS transistors 10 and 12 directly influences the detected voltage level. Specifically, if the threshold voltages of MOS transistors 10 and 12 each vary by ΔV, the detected voltage level varies by 2·ΔV. Therefore, the circuit utilizing the internal voltage generated by charge pump circuit 100 suffers from a disadvantage that the internal voltage level varies to reduce an operating margin.

Particularly, in a liquid crystal display device or the like containing a low-temperature polysilicon TFT circuit, variation in threshold voltage of the TFT (Thin Film Transistor) is large since a low-temperature processing is applied in view of protection of the substrate glass and thus polysilicon and a gate insulator film cannot sufficiently be annealed. In the case of generating an internal voltage for driving a switching transistor of an active matrix element in such liquid crystal display devices, if a low-temperature polysilicon TFT similar to the active matrix element is used for detection of the level of the internal voltage, the detected voltage level would significantly vary, and the active matrix element cannot accurately be driven AC-wise (switching transistor cannot be driven with a symmetrical waveform supplied to the gate).

The problem of the influence of threshold voltage on the detected voltage level for a negative voltage generated as the internal voltage as described above, when the negative voltage is generated as the internal voltage, the detected level of the negative voltage is influenced by the threshold voltage, similarly arises when a similar detection circuit is employed in the case of generating a boosted voltage by means of the charge pump circuit.

Moreover, when the voltage detection circuit shown in FIG. 1 is employed, its detecting voltage level is determined by an integer multiple of threshold voltage VTN of MOS transistors 10 and 12. Therefore, the voltage level of the internal voltage that can be generated, is set on the basis of a step of a threshold voltage of the MOS transistor, so that the internal voltage cannot be produced at a desired voltage level. Therefore, a problem arises that an internal voltage greater in absolute value than necessary may be generated to degrade the reliability of an element. When the voltage level of the internal voltage is determined by the threshold voltage of the MOS transistor, typically, threshold voltage VTN is on the order of 0.6V, and therefore, the influence on the reliability of the element will be more significant in a low power supply voltage environment in which the operating power supply voltage is as low as 1.8V to 1.5V.

DISCLOSURE OF THE INVENTION

An object of the present invention is to provide a voltage detection circuit capable of stable detection of a desired voltage level.

Another object of the present invention is to provide an internal voltage generation circuit capable of generation of an internal voltage accurately at a desired voltage level.

A further object of the present invention is to provide a voltage detection circuit capable of setting a detection voltage level at a desired voltage level in a stable manner without being influenced by a threshold voltage of a MOS transistor employed as a detection element.

A still further object of the present invention is to provide an internal voltage generation circuit that is, even if an MOS transistor is employed as a voltage level detecting element, capable of accurately generating an internal voltage at a voltage level that is not defined by a threshold voltage of the detecting MOS transistor.

An internal voltage generation circuit according to one aspect of the present invention includes a charge pump circuit for performing a charge pump operation in accordance with a repetition signal to produce an internal voltage at an output node, and a voltage level detection circuit detecting whether the internal voltage reaches a predetermined voltage level based on a difference between a reference voltage and the internal voltage. The voltage level detection circuit includes a detection transistor formed of an insulated gate field effect transistor receiving the reference voltage at its gate and selectively made conductive in accordance with the difference between the reference voltage and the internal voltage.

The internal voltage generation circuit according to the one aspect of the present invention further includes a reference voltage generation circuit generating the reference voltage such that an influence of at least the threshold voltage of the detection transistor on detection of the difference between the reference voltage and the internal voltage is cancelled out.

A voltage detection circuit according to another aspect of the present invention includes a first resistance element connected between a first power supply node and an output node, a second resistance element connected between a second power supply node and the output node, and a voltage level determination circuit for detecting whether an internal voltage reaches a prescribed voltage level based on a difference between a voltage of the output node and the internal voltage.

In the configuration in which the level of the internal voltage is detected by means of the insulated gate field effect transistor made selectively conductive in accordance with the difference between the reference voltage and the internal voltage, the reference voltage is generated such that the influence of the threshold voltage of the detection transistor is cancelled out. As a result, even if the threshold voltage of the detection transistor varies due to variation in manufacturing parameters and operating environment, the level of the internal voltage will not be influenced by the variation in threshold voltage and can accurately be detected, whereby the internal voltage can be generated at a desired voltage level.

In addition, since the influence of the threshold voltage is cancelled out, the level of the internal voltage can be set independently of the variation in threshold voltage, whereby the internal voltage can be set at a desired voltage level in a stable manner. In canceling out the influence of the threshold voltage, the reference voltage can be generated such that the threshold voltage itself can be cancelled out. As a result, the voltage level of the internal voltage can be set at a voltage level independent of the threshold voltage, whereby the internal voltage can be generated at a desired voltage level.

In detecting the voltage level, voltages of the first and second power supply nodes are resistance-divided by the resistance elements to generate the reference voltage, and a reference voltage of a desired voltage level can be generated by adjusting the voltage-division ratio of the resistance division. Determination of the level of the internal voltage based on the difference between the reference voltage and the internal voltage allows the determination-objective voltage level of the internal voltage to be set at a desired voltage level. Through control on an internal voltage generating operation in accordance with the determination result, the internal voltage can be generated at a desired voltage level.

The aforementioned objects and other objects and features of the present invention will become more apparent by reference to the following detailed description of the preferred embodiments taken in conjunction with the accompanying drawings.

BEST MODES FOR CARRYING OUT THE INVENTION

First Embodiment

Figures 3, 4:
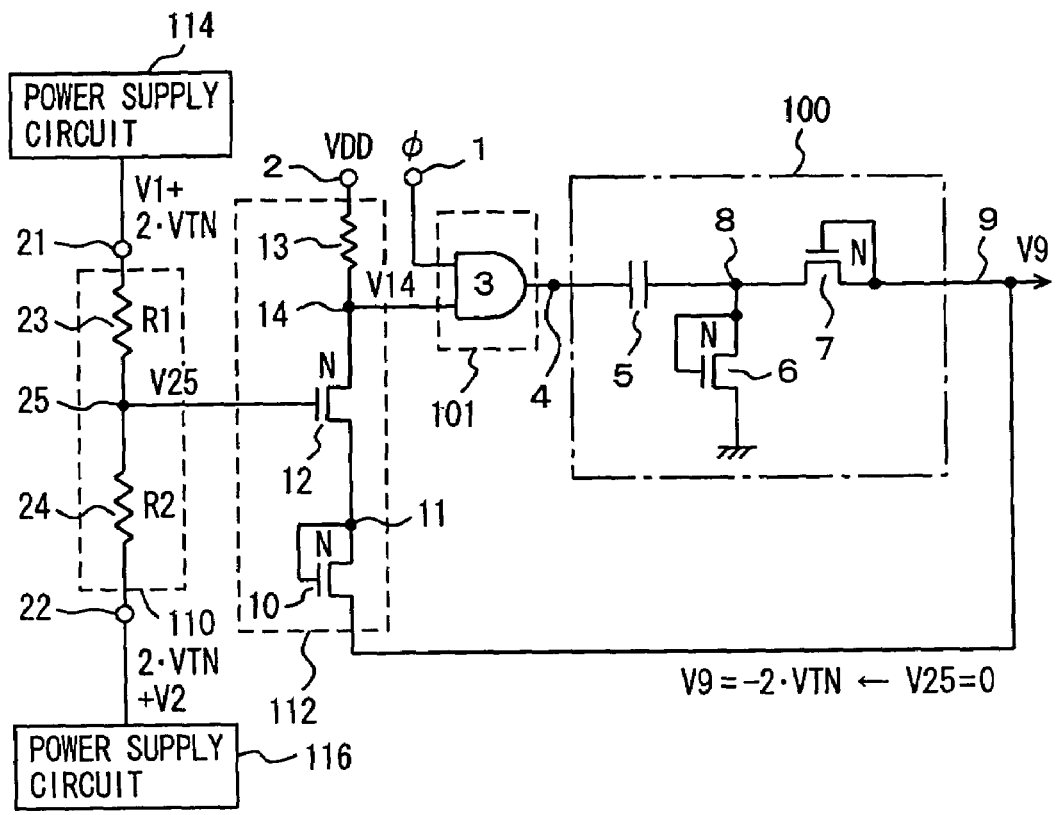
FIG. 3 shows the configuration of an internal voltage generation circuit according to a first embodiment of the present invention.
FIG. 4 shows the configuration of an internal voltage generation circuit according to a second embodiment of the present invention.

FIG. 3 shows the configuration of an internal voltage generation circuit according to a first embodiment of the present invention. In FIG. 3, the internal voltage generation circuit includes a charge pump circuit 100 performing a charge pump operation to generate an internal voltage V9 at an output node 9 when made active, a reference voltage generation circuit 110 for generating a reference voltage V25 from voltages V1+2·VTN and V2+2·VTN applied to first and second power supply nodes 21 and 22, respectively, a voltage level determination circuit 112 for determining whether the voltage level of internal voltage V9 reaches a prescribed voltage level based on a difference between reference voltage V25 and internal voltage V9, and a charge pump control circuit 101 for selectively applying, based on a determination result from voltage level determination circuit 112, a repetition signal φ applied to a clock input node 1 to charge pump circuit 100.

Figure 1:
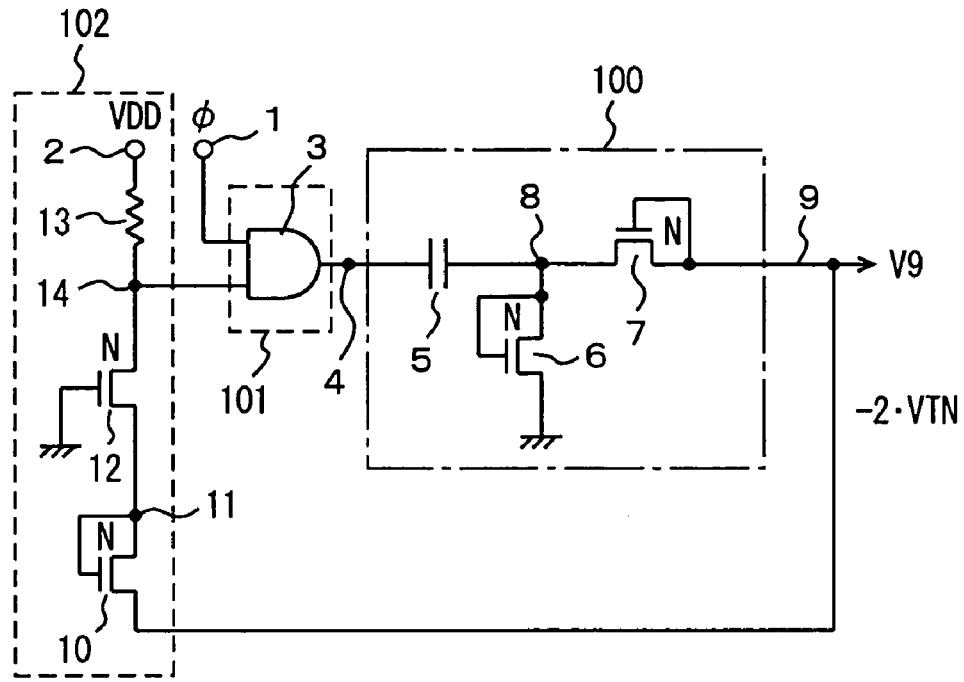
FIG. 1 shows an example of the configuration of a conventional internal voltage generation circuit.
Figure 2:
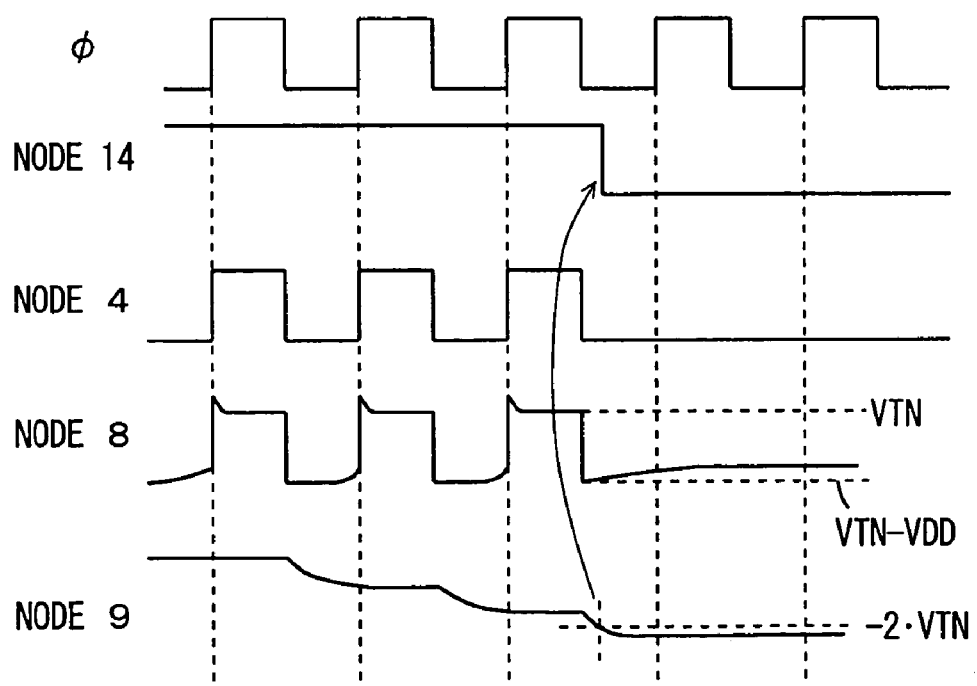
FIG. 2 is a timing diagram representing an operation of the internal voltage generation circuit shown in FIG. 1.

Similarly to the conventional internal voltage generation circuit shown in FIG. 1, charge pump circuit 100 includes a capacitive element 5 performing the charge pump operation, a diode-connected N channel MOS transistor 6 for precharging an internal node 8, and a diode-connected N channel MOS transistor 7 for supplying negative charges from internal node 8 to output node 9.

Charge pump control circuit 101 includes an AND circuit 3 receiving a determination result signal V14 from voltage level determination circuit 112 and repetition signal φ. An output signal from AND circuit 3 is applied via a node 4 to capacitive element 5 in charge pump circuit 100.

Reference voltage generation circuit 110 includes a resistance element 23 connected between first power supply node 21 and a node 25, and a resistance element 24 connected between second power supply node 22 and node 25. Resistance elements 23 and 24 have resistance values R1 and R2, respectively. Reference voltage V25 is generated at node 25.

Voltage level determination circuit 112 includes a resistance element 13 of high resistance connected between a main power supply node 2 and a node 14, an N channel MOS transistor 12 connected between a node 14 and a node 11 and receiving reference voltage 25 at its gate, and an N channel MOS transistor 10 connected between node 11 and output node 9 of charge pump circuit 100 and having its gate connected to node 11.

Voltage level determination circuit 112 is different in configuration from voltage detection circuit 102 shown in FIG. 1 in that the gate of MOS transistor 12 is supplied with reference voltage V25 from reference voltage generation circuit 110, instead of the ground voltage.

MOS transistors 10 and 12 each have a threshold voltage, VTN.

A voltage of V1+2·VTN is applied from a power supply circuit 114 to first power supply node 21, while a power supply voltage of V2+2·VTN is applied from a power supply circuit 116 to second power supply node 22. The configuration of power supply circuits 114 and 116 will be described in detail later.

When a difference between reference voltage V25 and output voltage V9 from charge pump circuit 100 attains 2·VTN, both MOS transistors 10 and 12 in voltage level determination circuit 112 turn conductive, and a voltage drop occurs across resistance element 13. Output signal V14 (an indication of determination result of the voltage level) attains an L level. Accordingly, the output signal from AND circuit 3 in charge pump control circuit 101 is fixed at the L level regardless of repetition signal φ, and the pump operation of charge pump circuit 100 is stopped.

When the difference between reference voltage V25 and output voltage V9 from charge pump circuit 100 is smaller than 2·VTN, at least one of MOS transistors 10 and 12 is non-conductive, and the voltage drop does not occur across resistance element 13. Therefore, output signal V14 from voltage level determination circuit 112 attains an H level, and charge pump control circuit 101 applies repetition signal φ to charge pump circuit 100.

Reference voltage generation circuit 110 is a resistance type voltage divider formed of resistance elements 23 and 24. Reference voltage V25 generated at node 25 is given by the following equation (3).

$$V25 = 2 \cdot VTN + (R2 \cdot V1 + R1 \cdot V2)/(R1+R2) \qquad (3)$$

The first term in the right side of the above equation (3) is equal to a sum of the threshold voltages of MOS transistors 10 and 12. Therefore, when the threshold voltages of MOS transistors 10 and 12 vary, a voltage component of 2·VTN included in reference voltage V25 also varies correspondingly. Accordingly, the variation in threshold voltages of MOS transistors 10 and 12 is cancelled out. For example, when threshold voltages VTNs of MOS transistors 10 and 12 increase, the first term in the right side of the above equation (3) also increases by the same amount. In this case, the voltage of the gate electrode of each of MOS transistors 10 and 12 increases by the same amount as the increase in the threshold voltage of MOS transistors 10 and 12. Therefore, MOS transistors 10 and 12 each turns conductive when a potential difference equal to a non-varied threshold voltage (a target threshold voltage) arises between its gate and source. Voltage V9 applied from charge pump circuit 100 to output node 9 is given by the following equation.

$$V9 = (R2 \cdot V1 + R1 \cdot V2)/(R1+R2) \qquad (4)$$

As represented in the above equation (4), parameters determining the voltage level of internal voltage V9 do not include threshold voltage components of MOS transistors 10 and 12. Thus, internal voltage V9 generated by charge pump circuit 100 can be set at a desired voltage level by resistance values R1 and R2 of resistance elements 23 and 24 and the voltage components V1 and V2 generated by power supply circuits 114 and 116.

Voltages V1 and V2 are generally determined by external factors such as the circuit configurations of power supply circuits 114 and 116 and the available power supply voltage level. Adjustment of resistance values R1 and R2 of resistance elements 23 and 24 enables internal voltage V9 to be set at a desired voltage level. Therefore, when this internal voltage V9 is used as a substrate bias voltage in a DRAM for example, internal voltage V9 can be set at more optimal value than in the case where a voltage level of a substrate bias is determined in steps of threshold voltages. In addition, in an image display circuit device utilizing TFTs, the gate of a pixel transistor can be driven accurately.

Particularly, when internal voltage V9 outputted from charge pump circuit 100 is to be set at a voltage level of −2·VTN, reference voltage V25 is merely required to have the ground voltage level. Thus, resistance values R1 and R2 and voltages V1 and V2 need only be set such that the following equation (5) can be satisfied.

$$V9 = (R2 \cdot V1 + R1 \cdot V2)/(R1+R2) = -2 \cdot VTN \qquad (5)$$

In the configuration shown in FIG. 3, a voltage at a level of −2·VTN+Va can be produced as internal voltage V9. Accordingly, internal voltage V9 can be set at a desired voltage level with the variation in threshold voltage VTN cancelled out.

Instead of AND circuit 3, an NAND circuit may be employed in charge pump control circuit 101. When the charge pump operation is to be stopped, a signal at the H level is applied to capacitive element 5. Output MOS transistor 7 can be maintained in a reverse bias state by the potential of node 8. In this way, the operation of supplying the negative charges can be stopped in a reliable manner.

Second Embodiment

FIG. 4 shows the configuration of an internal voltage generation circuit according to a second embodiment of the present invention. In the configuration of the internal voltage generation circuit shown in FIG. 4, voltage level determination circuit 112 has two diode-connected MOS transistors 10*a* and 10*b* connected in series between MOS transistor 12 and output node 9 of charge pump circuit 100. Power supply circuits 114 and 116, though not shown, apply voltages of V1+3·VTN and V2+3·VTN to power supply nodes 21 and 22, respectively. The remaining configuration of the internal voltage generation circuit in FIG. 4 is the same as that of the internal voltage generation circuit in FIG. 3. Therefore, the same reference numerals are assigned to corresponding portions, and the detailed description thereof will not be repeated.

In the configuration of the internal voltage generation circuit shown in FIG. 4, reference voltage V25 is given by the following equation.

$$V25 = 3 \cdot VTN + (R2 \cdot V1 + R1 \cdot V2)/(R1+R2) \quad (6)$$

MOS transistor 10*b* turns conductive when a voltage difference of threshold voltage VTN is present between a node 11*b* and output node 9, while MOS transistor 10*a* turns conductive when a voltage difference of threshold voltage VTN is present between nodes 11*a* and 11*b*. MOS transistor 12 turns conductive when the voltage of node 11*a* attains V25−VTN. When all MOS transistors 10*a*, 10*b*, and 12 conduct, a current flows, and a voltage drop across resistance element 13 is caused to set the voltage V14 from node 14 at the L level. Therefore, in this case, internal voltage V9 is set at a level of V25−3·VTN.

Therefore, also in the shown configuration, even when threshold voltages VTNs of MOS transistors 10*a*, 10*b*, and 12 vary, such variation is cancelled out by a voltage component of 3·VTN included in reference voltage V25 generated by reference voltage generation circuit 110.

As a result, the voltage level of output voltage V9 output by charge pump circuit 100 can be set at a desired voltage level in a stable manner without being affected by the variation in threshold voltage. In the configuration of internal voltage generation circuit shown in FIG. 4, internal voltage V9 is represented by the following equation (7).

$$V9 = V25 - 3 \cdot VTN \quad (7)$$
$$= (R1 \cdot V2 + R2 \cdot V1)/(R1 + R2)$$

As seen from the above equation (7), internal voltage V9 is a voltage independent of threshold voltage VTN. Therefore, internal voltage V9 can be set stably at a desired voltage level without being affected by the variation in threshold voltage.

In the configuration of the internal voltage generation circuit shown in FIG. 4, when reference voltage V25 is set at the ground voltage level, the voltage level of internal voltage V9 becomes −3·VTN in accordance with the above equation (7).

Modification

Figure 5:
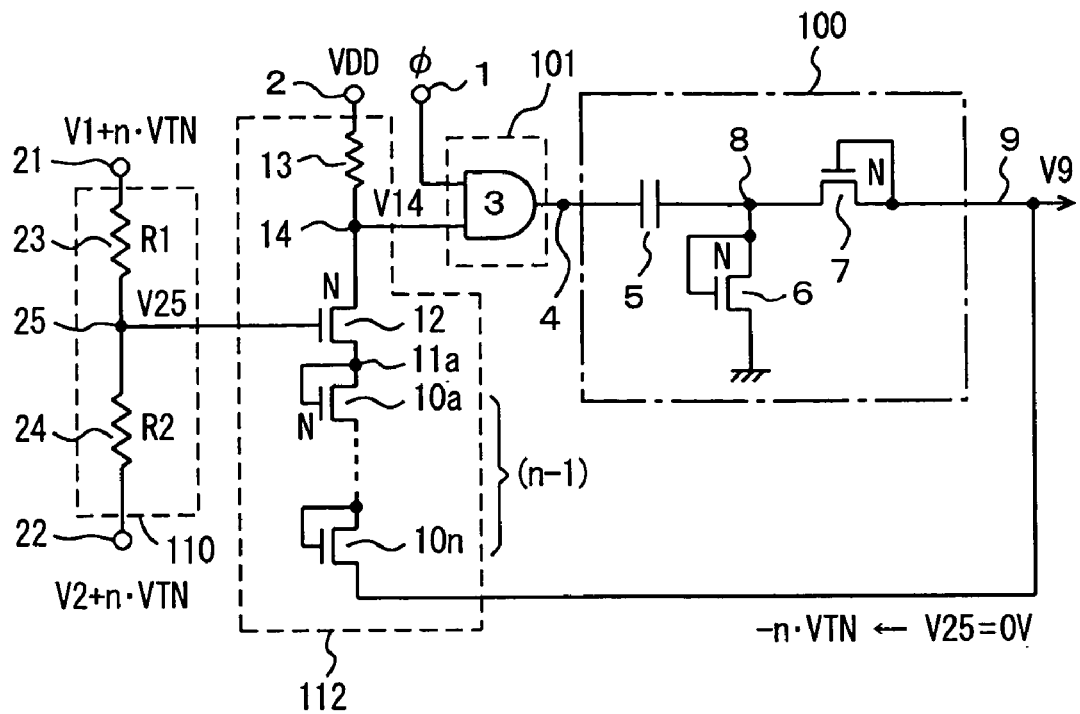
FIG. 5 shows a modification of the second embodiment of the present invention.

FIG. 5 shows the configuration of an internal voltage generation circuit according to a modification of the second embodiment of the present invention. In the internal voltage generation circuit shown in FIG. 5, voltage level determination circuit 112 has (n−1) N-channel MOS transistors 10*a* to 10*n* connected in series between node 11*a* and output node 9 of charge pump circuit 100. MOS transistors 10*a* to 10*n* each have respective gate and drain connected together. MOS transistors 10*a* to 10*n* may each operate in a diode mode and cause a voltage drop of threshold voltage VTN when made conductive. Alternatively, MOS transistors 10*a* to 10*n* may each operate in a resistance mode, and cause a voltage drop through the on-resistance when made conductive. In this configuration, AND circuit 3 need only determine the voltage V14 as being an L level when all MOS transistors 10*a* to 10*n* turn conductive.

For reference voltage generation circuit 110, a voltage of V1+n·VTN is applied to first power supply node 21, while a voltage of V2+n·VTN is applied to second power supply node 22. The remaining configuration of the internal voltage generation circuit in FIG. 5 is the same as that of the internal voltage generation circuit in FIG. 4. Therefore, the same reference numerals are assigned to corresponding portions, and the detailed description thereof will not be repeated.

In the internal voltage generation circuit shown in FIG. 5, reference voltage V25 generated by reference voltage generation circuit 110 is given by the following equation.

$$V25 = n \cdot VTN + (R2 \cdot V1 + R1 \cdot V2)/(R1+R2) \quad (8)$$

When internal voltage V9 attains a voltage of V25−n·VTN, MOS transistors 10*a* to 10*n* and 12 turn conductive and shift down the voltage V14 of node 14. Responsively, the output signal from AND circuit 3 attains the L level, and the pump operation of charge pump circuit 100 is stopped. Therefore, internal voltage V9 has a voltage level expressed by the following equation (9).

$$V9 = V25 - n \cdot VTN \quad (9)$$
$$= (R2 \cdot V1 + R1 \cdot V2)/(R1 + R2)$$

Therefore, in the internal voltage generation circuit in FIG. 5 as well, adjustment of resistance values R1 and R2 of resistance elements 23 and 24 enables the production of internal voltage V9 at a desired voltage level. The voltage component of n·VTN is included in reference voltage V25. Therefore, even if threshold voltages of MOS transistors 12 and 10*a* to 10*n* vary, the variation in threshold voltage is cancelled out by the voltage component of n·VTN included in reference voltage V25. Accordingly, the voltage level of internal voltage V9 can be set at a desired voltage level without being affected by the variation in threshold voltage. When reference voltage V25 is set at the ground voltage, internal voltage V9 has a voltage level of −n·VTN.

As described above, when a plurality of series-connected MOS transistors are employed for voltage level detection of the internal voltage, the reference voltage is generated such that it includes the threshold voltage components of the plurality of MOS transistors. As a result, the variation in threshold voltage can be cancelled out so that the internal voltage can stably be generated at a desired voltage level.

Third Embodiment

Figure 6:
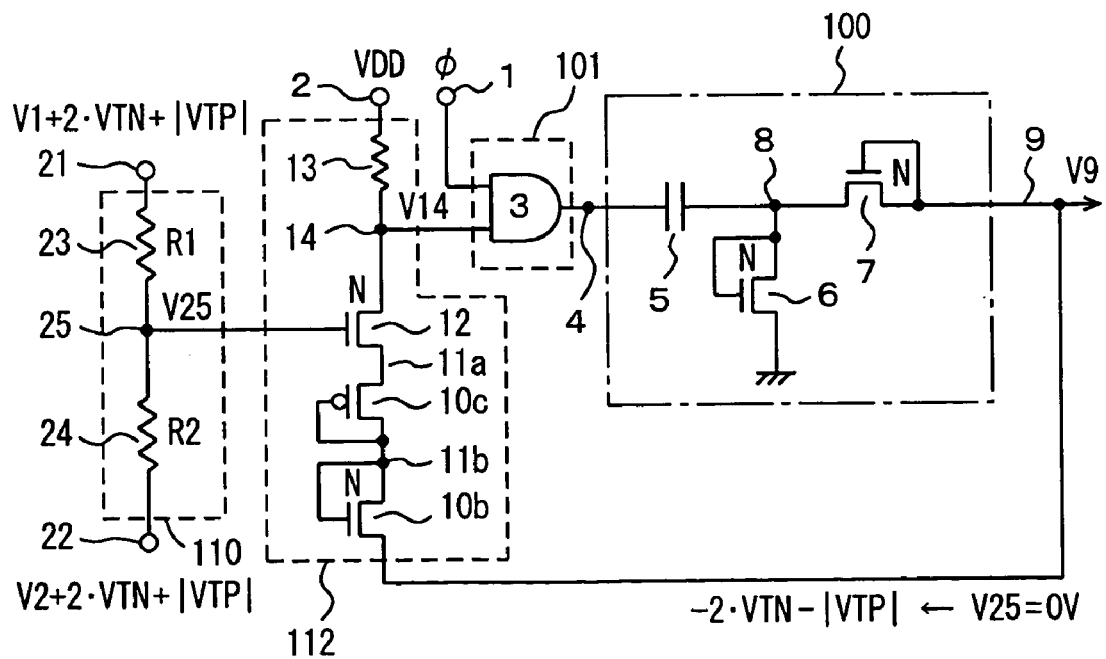
FIG. 6 shows the configuration of an internal voltage generation circuit according to a third embodiment of the present invention.

FIG. 6 shows the configuration of an internal voltage generation circuit according to a third embodiment of the present invention. In the internal voltage generation circuit shown in FIG. 6, voltage level determination circuit 112 has a diode-connected or resistance-connected P channel MOS transistor 10*c* connected between nodes 11*a* and 11*b*. In reference voltage generation circuit 110, a voltage of V1+2·VTN+|VTP| is applied to first power supply node 21, while a voltage of V2+2·VTN+|VTP| is applied to second power supply node 23. Here, VTP represents a threshold voltage of P channel MOS transistor 10c. The remaining configuration of the internal voltage generation circuit in FIG. 6 is the same as that of the internal voltage generation circuit in FIG. 4. Therefore, the same reference numerals are assigned to corresponding portions, and the detailed description thereof will not be repeated.

In voltage level determination circuit 112 shown in FIG. 6, both MOS transistors 10b and 10c turn conductive when a voltage drop of VTN+|VTP| occurs between node 11a and output node 9 of charge pump circuit 100. MOS transistor 12 turns conductive when a difference between reference voltage V25 and a voltage of node 11a attains VTN. At this stage, the output voltage V14 from node 14 of voltage level determination circuit 112 attains the L level, and the charge pump operation of charge pump circuit 100 is stopped. Therefore, internal voltage V9 has a voltage level as represented by the following equation (10).

$$V9 = V25 - 2 \cdot VTN + |VTP| \quad (10)$$

Reference voltage V25 is given by the following equation (11).

$$V25 = 2 \cdot VTN + |VTP| + (R2 \cdot V1 + R1 \cdot V2)/(R1+R2) \quad (11)$$

As seen in the above equation (11), when threshold voltages VTNs of MOS transistors 10b and 12 and threshold voltage VTP of MOS transistor 10c vary, the same amount of variation as this variation in threshold voltage occurs in reference voltage V25 as well. Accordingly, even if the threshold voltages of MOS transistors 10b, 10c, and 12 for voltage level detection of internal voltage V9 vary in voltage level determination circuit 112, such variation is cancelled out in reference voltage V25. As a result, internal voltage V9 can be set accurately at a voltage level independent of threshold voltages VTP and VTN.

When P channel MOS transistor 10c and N channel MOS transistor 10b are utilized as voltage dropping elements, their threshold voltages VTP and VTN can be set at individual voltage levels, whereby internal voltage V9 can be set in finer steps. In particular, when reference voltage 5 is set at the ground voltage level as well, through setting of threshold voltages VTN and VTP of MOS transistors 10b and 10c at appropriate values, the voltage level of internal voltage V9 can be set at a desired voltage level.

In the configuration of the internal voltage generation circuit in FIG. 6 as well, if the total number of MOS transistors 10b and 12 is n and the number of P channel MOS transistor 10c is p in voltage level determination circuit 112, voltages of V1+n·VTN+p·|VTP| and V2+n·VTN+p·|VTP| are applied to power supply nodes 21 and 22, respectively.

The P and N channel MOS transistors utilized as voltage dropping elements in voltage level determination circuit 112 may be connected in any order.

As described above, according to the third embodiment of the present invention, the MOS transistors different in conductivity type are employed as voltage dropping elements in the voltage level determination circuit. Their threshold voltages can be set individually. As a result, the internal voltage can be set in finer steps.

Fourth Embodiment

Figure 7:
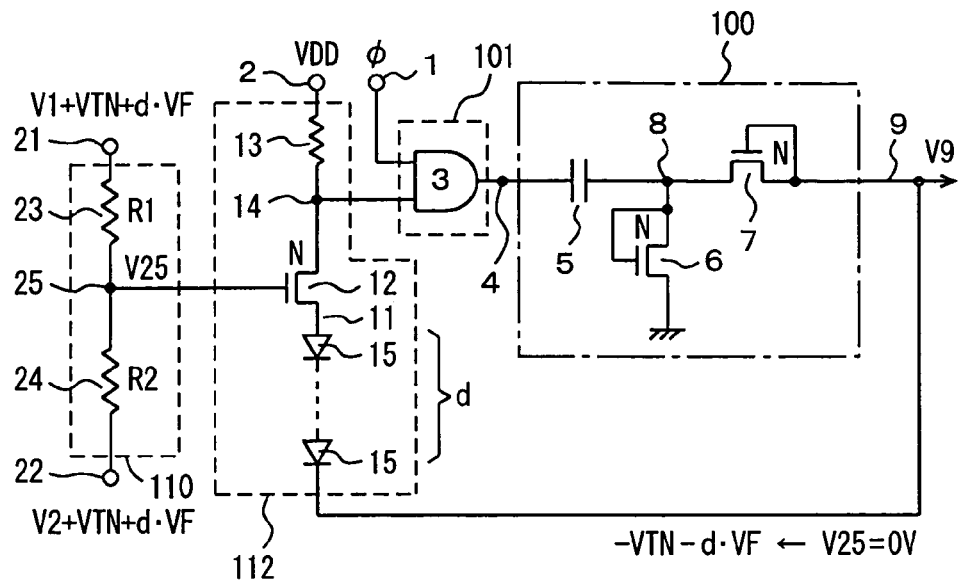
FIG. 7 shows the configuration of an internal voltage generation circuit according to a fourth embodiment of the present invention.

FIG. 7 shows the configuration of an internal voltage generation circuit according to a fourth embodiment of the present invention. In the internal voltage generation circuit shown in FIG. 7, voltage level determination circuit 112 has d diode elements 15, connected in series in a forward direction viewed from node 11, between node 11 and output node 9 of charge pump circuit 100.

In reference voltage generation circuit 110, a voltage of V1+VTN+d·VF is applied to first power supply node 21, while a voltage of V2+VTN+d·VF is applied to second power supply node 22. Here, VF represents a forward voltage drop of diode element 15.

The remaining configuration of the internal voltage generation circuit in FIG. 7 is the same as that of the internal voltage generation circuit in FIG. 5. Therefore, the same reference numerals are assigned to corresponding portions, and the detailed description thereof will not be repeated.

In the configuration of the internal voltage generation circuit shown in FIG. 7, d diodes 15 in voltage level determination circuit 112 turn conductive when a voltage difference between node 11 and output node 9 attains d·VF. MOS transistor 12 turns conductive when the voltage between the gate and the source attains VTN. Therefore, internal voltage V9 generated by charge pump circuit 100 is given by the following equation (12).

$$V9 = V25 - VTN - d \cdot VF \quad (12)$$
$$= (R2 \cdot V1 + R1 \cdot V2)/(R1+R2)$$

When reference voltage V25 is set at the ground voltage level, the voltage level of internal voltage V9 is −VTN−d·VF.

In the configuration in which d diode elements 15 are connected in series in voltage level determination circuit 112 as well, the variation in threshold voltage can be compensated for accurately so that internal voltage V9 can be maintained at a desired voltage level even when the forward voltage drops of the diode elements and the threshold voltage of MOS transistor 12 would vary.

When diode element 15 is utilized in voltage level determination circuit 112 as a voltage dropping element, an occupation area is reduced as compared to the case where the MOS transistor is utilized. In addition, when MOS transistor 12 is formed of a TFT, such voltage dropping diodes can easily be formed with the same impurity concentration of this TFT (with the polysilicon region being a P type region, and the source/drain region being an N type region).

When reference voltage V25 is set at the ground voltage level and internal voltage V9 is set at a voltage of −VTN−d·VF, the number, d, of diode elements 15 need only be determined as appropriate in accordance with the voltage level of internal voltage V9. In addition, the number of diodes 15 need only be determined as appropriate in accordance with the available voltage levels for the voltages V1 and V2.

When voltage level determination circuits 112 in FIGS. 5 and 7 are combined so that (n−1) N channel MOS transistors and d diode elements 15 are connected in series between the source node of detecting MOS transistor 12 and output node 9 of charge pump circuit 100, a voltage of V1+n·VTN+d·VF is applied to first power supply node 21, while a voltage of V2+n·VTN+d·VF is applied to second power supply node 22.

Modification

Figure 8:
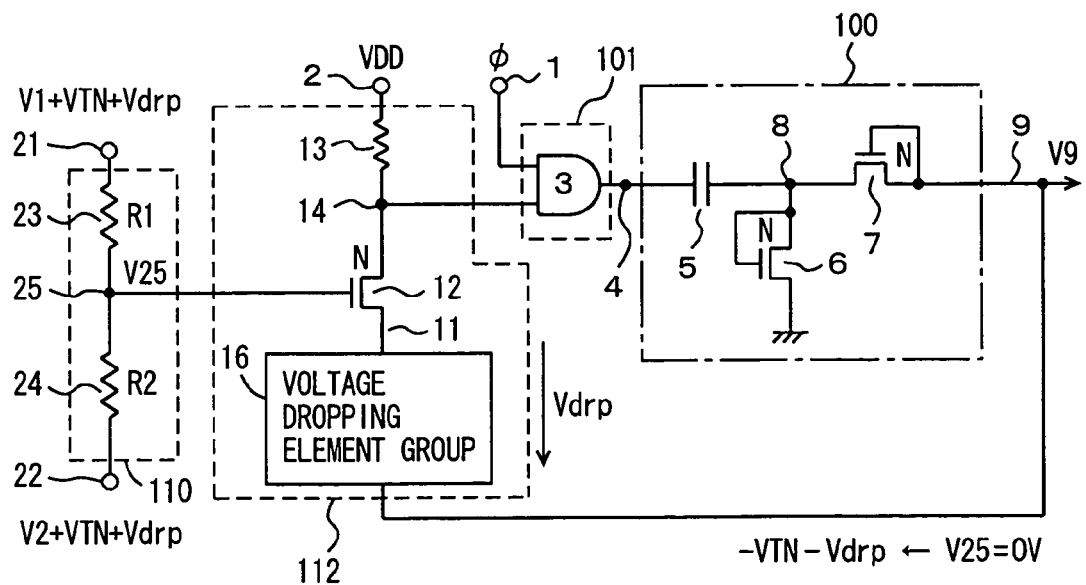
FIG. 8 shows a modification of the fourth embodiment of the present invention.

FIG. 8 shows the configuration of an internal voltage generation circuit according to an exemplary modification of the fourth embodiment of the present invention. In the internal voltage generation circuit shown in FIG. 8, voltage level determination circuit 112 has a voltage dropping element group 16 arranged between node 11 and output node 9 of charge pump circuit 100. Voltage dropping element group 16 causes a voltage drop of Vdrp between nodes 11 and 9 when made conductive. In reference voltage generation circuit 110, a voltage of V1+VTN+Vdrp is applied to power supply node 21, while a voltage of V2+VTN+Vdrp is applied to power supply node 22. Voltage dropping element group 16 is formed of diode-connected MOS transistors and/or diode elements connected in series.

The remaining configuration of the internal voltage generation circuit in FIG. 8 is the same as those of the internal voltage generation circuits in FIGS. 1 to 7. Therefore, the same reference numerals are assigned to corresponding portions, and the detailed description thereof will not be repeated.

In the configuration of the internal voltage generation circuit shown in FIG. 8, reference voltage V25 is given by the following equation (13).

$$V25 = VTN + Vdrp + (R1 \cdot V2 + R2 \cdot V1)/(R1+R2) \quad (13)$$

When the voltage of node 11 attains a voltage of V25−VTN, MOS transistor 12 turns conductive and stops the charge pump operation of charge pump circuit 100 via charge pump control circuit 101. Therefore, internal voltage V9 is given by the following equation (14).

$$V9 = V25 - VTN - Vdrp \quad (14)$$

Reference voltage V25 includes, as its voltage component, voltage drop Vdrp caused by voltage dropping element group 16. Therefore, the voltage level of internal voltage V9 can be set at a voltage level determined by values of the voltages V1 and V2 and resistance values R1 and R2. Accordingly, by setting the voltage level of internal voltage V9 coarsely by means of voltage dropping element group 16, and then adjusting the voltage level of internal voltage V9 finely using resistance values R1 and R2, the internal voltage can be generated at a desired voltage level.

A voltage dropping element included in voltage dropping element group 16 operates in a diode mode when made conductive and causes a voltage drop equal to the threshold voltage or a PN junction built-in voltage (forward voltage drop). The elements in voltage dropping element group 16, however, each turn conductive to form a current flowing path when a voltage difference of the threshold voltage or the forward voltage drop is produced, and the shifted down voltage may have a voltage level different from that of the threshold voltage or the forward drop voltage. That is, the element in voltage dropping element group 16 may operate in a resistance mode.

As described above, according to the fourth embodiment of the present invention, even when an element other than the MOS transistor is employed as the voltage dropping element for detecting the voltage level of the internal voltage, the internal voltage can be generated stably at a desired voltage level by including the voltage drop component of the voltage dropping element in the reference voltage.

Fifth Embodiment

Figure 9:
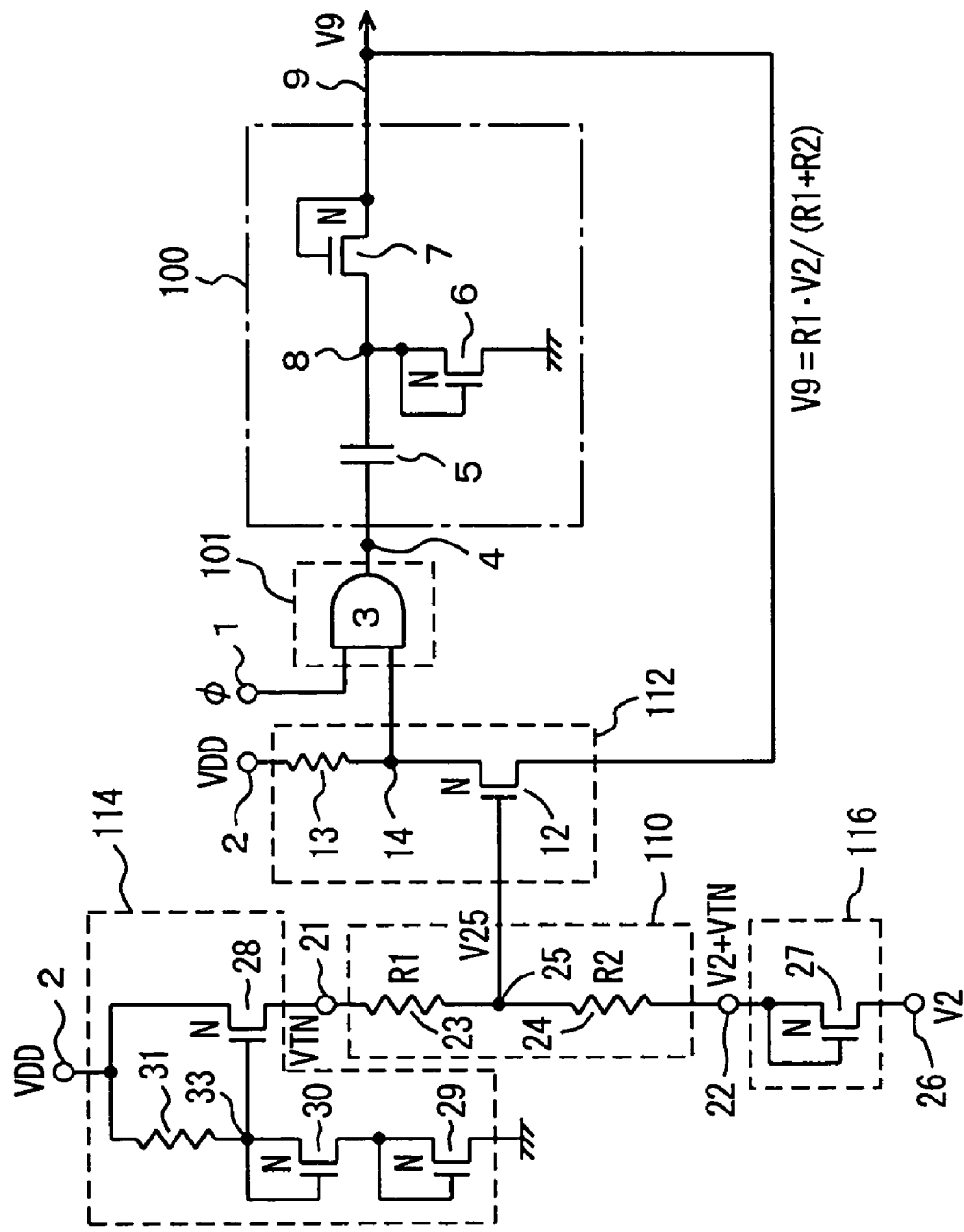
FIG. 9 shows the configuration of an internal voltage generation circuit according to a fifth embodiment of the present invention.

FIG. 9 shows the configuration of an internal voltage generation circuit according to a fifth embodiment of the present invention. Referring to FIG. 9, the power supply circuits 114 and 116 in the internal voltage generation circuit is shown for the configuration of the internal voltage generation circuit in FIG. 5 in which the number of diode-connected or resistance-connected N channel MOS transistors 10a to 10n is 0, and the voltage at a power supply node 21 of reference voltage generation circuit 110 is equal to VTN, or V1=0V. The configurations and operations of charge pump circuit 100 and charge pump control circuit 101 are the same as those in the first to the fourth embodiments as describe above. The same reference numerals are assigned to corresponding portions, and the detailed description thereof will not be repeated.

Power supply circuit 114 includes a resistance element 31 of high resistance connected between main power supply node 2 and a node 33, diode-connected N channel MOS transistors 30 and 29 connected in series between node 33 and the ground node, and an N channel MOS transistor 28 connected between main power supply node 2 and power supply node 21 and having its gate connected to node 33.

On-resistances of MOS transistors 29 and 30 are sufficiently smaller than the resistance value of resistance element 31. Therefore, MOS transistors 30 and 29 each operate in a diode mode and cause a voltage drop equal to each respective threshold voltage VTN. Under such a condition, the voltage of node 33 is 2·VTN.

Since MOS transistor 28 has its gate potential lower than a drain potential VDD, MOS transistor 28 operates in a source follower mode and supplies a voltage of 2·VTN−VTN=VTN to first power supply node 21. Here, the threshold voltages of all the N channel MOS transistors utilized in the internal voltage generation circuit are assumed to be VTN.

Power supply circuit 116 includes an N channel MOS transistor 27 connected between a negative potential supply node 26 and power supply node 22. N channel MOS transistor 27 has its gate connected to second power supply node 22, operates in a diode mode, and causes the voltage drop equal to threshold voltage VTN. Therefore, a voltage of V2+VTN is supplied to second power supply node 22. Here, negative voltage V2 is applied to power supply node 26. Negative voltage V2 may be externally applied or may be internally generated by another internal negative voltage generation circuit.

In the internal voltage generation circuit shown in FIG. 9, reference voltage V25 is given by the following equation (15).

$$V25 = 2 \cdot VTN + (R1 \cdot V2)/(R1+R2) \quad (15)$$

Therefore, setting resistance values R1 and R2 at appropriate values enables the voltage level of reference voltage V25 to be set at a desired voltage level. In addition, voltage component VTN included in reference voltage V25 is cancelled out by threshold voltage VTN of MOS transistor 12 in voltage level determination circuit 112, and internal voltage V9 can be set at a voltage level of R1·V2/(R1+R2).

As described above, according to the fifth embodiment of the present invention, the voltage drop equal to the threshold voltage of the MOS transistor operating in a diode mode is utilized to generate the power supply voltage for the reference voltage generation circuit. The voltage including the threshold voltage component of the MOS transistor detecting the internal voltage level can be supplied accurately as a power supply voltage to the reference voltage generation circuit.

Sixth Embodiment

Figure 10:
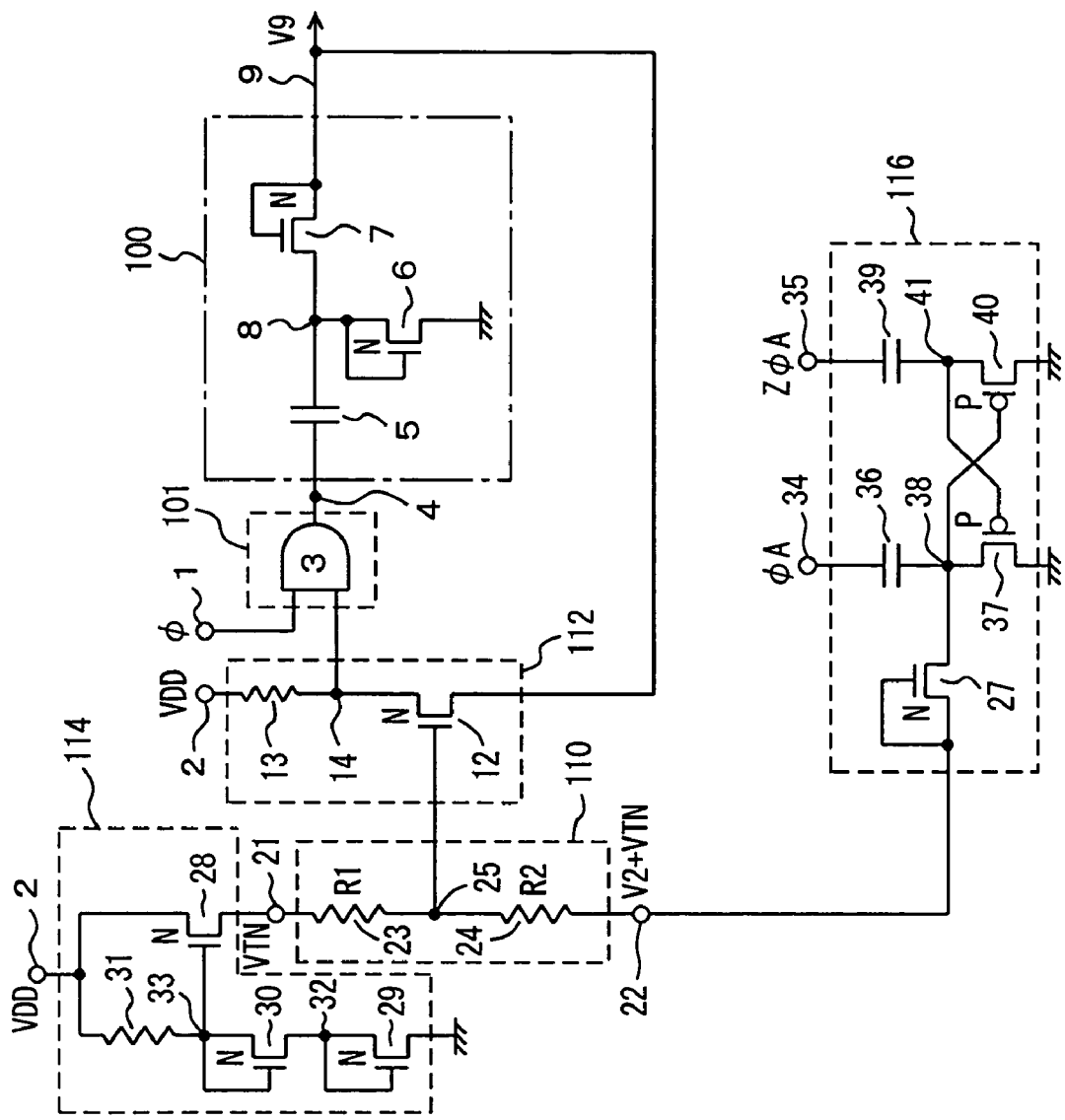
FIG. 10 shows the configuration of an internal voltage generation circuit according to a sixth embodiment of the present invention.

FIG. 10 shows the configuration of an internal voltage generation circuit according to a sixth embodiment of the present invention. The internal voltage generation circuit shown in FIG. 10 is the same in configuration as the internal voltage generation circuit in FIG. 9 except for the configuration of power supply circuit 116. Power supply circuit 114, reference voltage generation circuit 110, voltage level determination circuit 112, charge pump control circuit 101, and charge pump circuit 100 in FIG. 10 have the same reference numerals as those for the corresponding portions shown in FIG. 9, and the detailed description thereof will not be repeated.

In FIG. 10, power supply circuit 116 includes a capacitive element 36 supplying charges to a node 38 in accordance with a repetition signal φA applied to a node 34, a capacitive element 39 supplying charges to a node 41 in accordance with a complementary repetition signal ZφA applied to node 35, a P channel MOS transistor 37 connected between node 38 and the ground node and having its gate connected to node 41, a P channel MOS transistor 40 connected between node 41 and the ground node and having its gate connected to node 38, and an N channel MOS transistor 27 connected between second power supply node 22 of reference voltage generation circuit 110 and node 38 and having its gate connected to second power supply node 22.

Repetition signals φA and ZφA applied to nodes 34 and 35 respectively are signals complementary to each other, each having an amplitude of |V2|.

Figure 11:
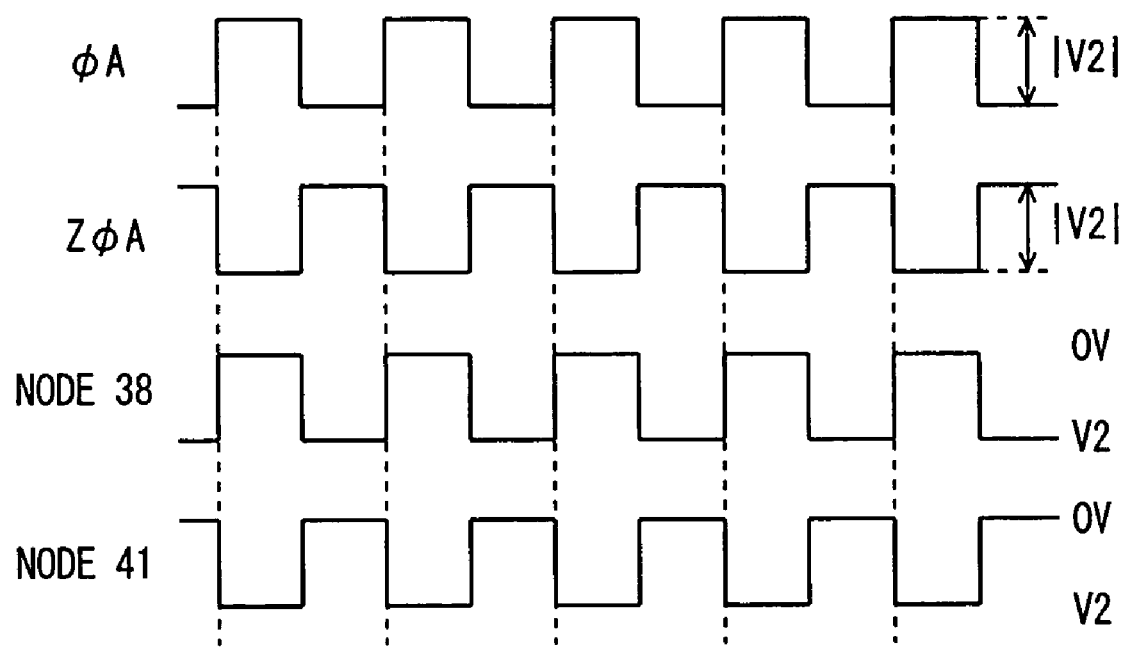
FIG. 11 is a timing diagram representing an operation of a power supply circuit in the internal voltage generation circuit shown in FIG. 10.

FIG. 11 is a timing diagram representing an operation of power supply circuit 116 in FIG. 10. The operation of power supply circuit 116 shown in FIG. 10 will now be described with reference to FIG. 11.

When repetition signal φA rises to the H level, the voltage level of node 38 is increased through a charge pump operation of capacitive element 36. At this time, repetition signal ZφA applied to node 35 falls down to the L level. Thus, charges are drawn from node 41 through capacitive element 39, whereby the voltage level of node 41 decreases. Therefore, when the voltage level of node 38 is at the ground voltage level or higher, MOS transistor 40 is turned off, and MOS transistor 37 is turned on. The MOS transistor 37 precharges the node 38 to the ground voltage level (the voltage of node 41 is a negative voltage). Even when node 38 is precharged to the ground voltage level, node 41 has a negative voltage level. MOS transistor 40 has the gate and the source at the same ground voltage level and is kept off.

In this state, if the voltage level of second power supply node 22 is lower than threshold voltage VTN of the MOS transistor, MOS transistor 27 is reverse-biased and is kept non-conductive.

When repetition signal φA falls down to the L level and repetition signal ZφA rises to the H level, charges are drawn from node 38 through the charge pump operation of capacitive element 36, and the voltage level of node 38 decreases to a level of negative voltage V2. In contrast, the voltage level of node 41 increases through the charge pump operation of capacitive element 39. MOS transistor 40 is turned on by the negative voltage of node 38 and precharges node 41 to the ground voltage level. Responsively, MOS transistor 37 is turned off, and node 38 maintains the voltage level of negative voltage V2. When the voltage level of node 38 is lower than the voltage of the second power supply node by threshold voltage VTN of MOS transistor 27, MOS transistor 27 turns conductive and transmits positive charges from second power supply node 22 to node 38, thereby decreasing the voltage level of second power supply node 22.

Subsequently, this operation is repeated so that node 38 alternately attains the ground voltage and negative voltage V2 in a steady state. When the voltage level of node 37 is negative voltage V2, MOS transistor 27 transmits a voltage of V2+VTN to second power supply node 22.

The operation that MOS transistor 27 supplies the negative charges to power supply node 22 every half cycle is the same as the operation that charges are supplied to output node 9 of charge pump circuit 100. Accordingly, the voltage of V2+VTN can be supplied to second power supply node 22 of reference voltage generation circuit 110. As a result, negative voltage V2 is generated in a semiconductor device utilizing internal voltage V9 so that internal voltage V9 can be produced at a desired voltage level.

The amplitudes of repetition signals φA and ZφA are each |V2|. In this case, external power supply voltage VDD is down-converted to produce voltage |V2|, and this down-converted voltage |V2| is supplied, as an operating power supply voltage, to a buffer circuit receiving repetition signal φ. As a result, repetition signals φA and ZφA each having amplitude |V2| can be produced from repetition signal φ having an amplitude of VDD. It is noted for this case that the amplitude |V2| should be not greater than power supply voltage VDD.

If the semiconductor device utilizing the internal voltage V9 is a circuit device operating in synchronization with a clock signal, the external clock signal may be employed as repetition signal φ. Alternatively, an oscillator circuit may be internally employed to produce repetition signal φ.

The configuration of the charge pump circuit generating the negative voltage and contained in power supply circuit 116 shown in FIG. 10 is a mere example. A negative voltage generation circuit with a different configuration may also be employed.

The difference between the reference voltage and internal voltage V9 is set at threshold voltage VTN in voltage level determination circuit 112. When the difference between reference voltage V25 and internal voltage V9 is Vdrp+VTN, a voltage dropping circuit causing the voltage drop of Vdrp is arranged between MOS transistor 29 and the ground node in power supply circuit 114, and a voltage dropping circuit causing the voltage drop of Vdrp is connected in series with MOS transistor 27 in power supply circuit 116. As a result, a voltage according to the voltage drop in voltage level determination circuit 112 can be produced as a power supply voltage to reference voltage generation circuit 110.

As described above, according to the sixth embodiment of the present invention, negative voltage V2 is generated within the circuit device, and voltage V2 can be produced at a desired voltage level.

Seventh Embodiment

Figure 12:
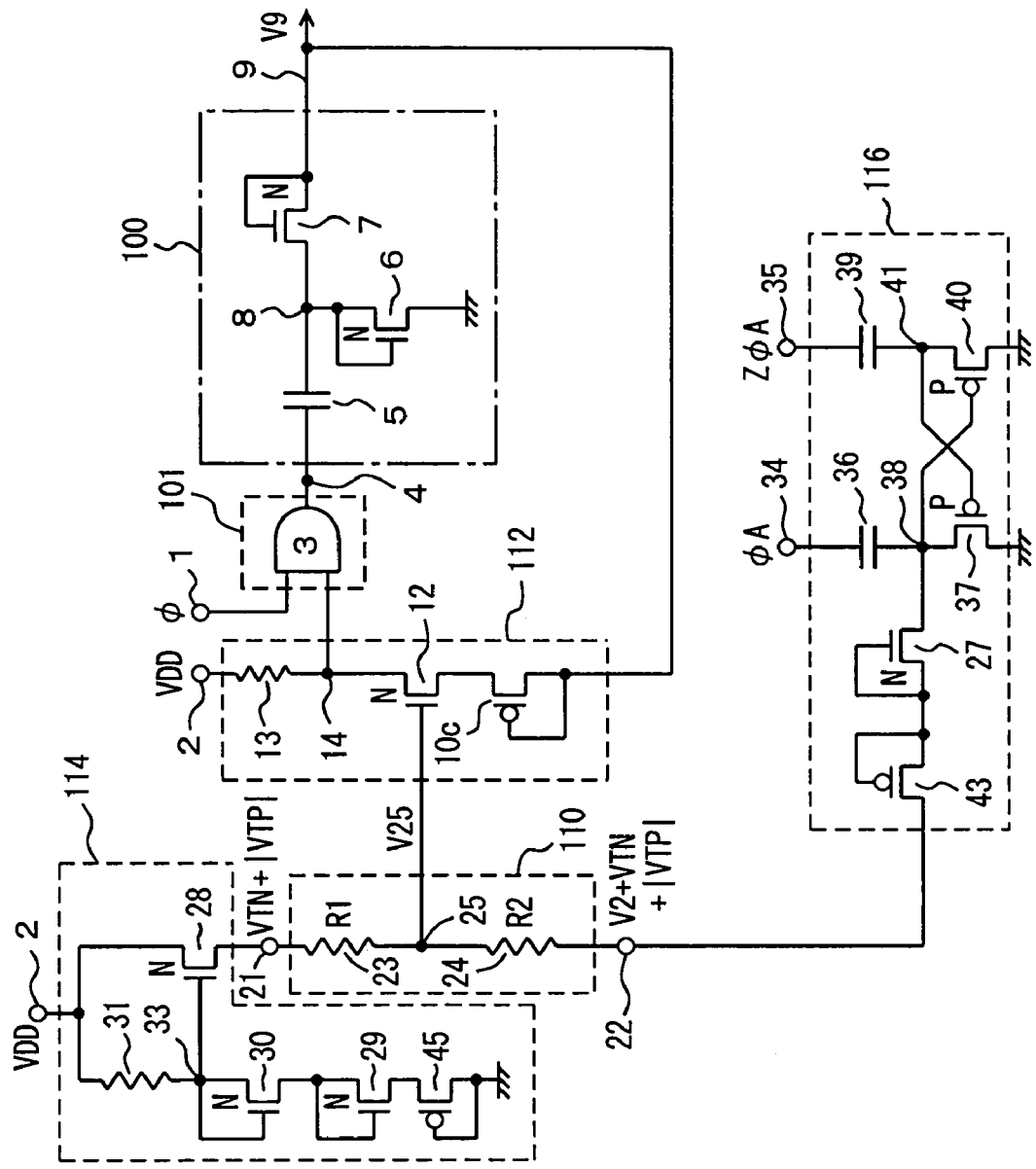
FIG. 12 shows the configuration of an internal voltage generation circuit according to with a seventh embodiment of the present invention.

FIG. 12 shows the configuration of an internal voltage generation circuit according to a seventh embodiment of the present invention. In the configuration of the internal voltage generation circuit shown in FIG. 12, voltage level determination circuit 112 has diode-connected or resistance-connected P channel MOS transistor 10c connected between MOS transistor 12 and output node 9 of charge pump circuit 100.

As a result of the connection of MOS transistor 10c, power supply circuit 114 is further provided with a diode-connected P channel MOS transistor 45 connected between MOS transistor 29 and the ground node. In addition, power supply circuit 116 further includes a diode-connected P channel MOS transistor 43 connected between MOS transistor 27 and power supply node 22. The remaining configuration of the internal voltage generation circuit in FIG. 12 is the same as that of the internal voltage generation circuit in FIG. 10. Therefore, the same reference numerals are assigned to corresponding portions, and the detailed description thereof will not be repeated.

MOS transistor 10c turns conductive when its gate to source voltage attains VTP. MOS transistors 45 and 43 cause a voltage drop of |VTP| when made conductive. Therefore, in power supply circuit 114, the voltage of node 33 is set to 2·VTN+|VTP|. Accordingly, the voltage of first power supply node 21 is set to the level of VTN+|VTP| by a source follower operation of MOS transistor 28.

MOS transistors 43 and 27 cause a voltage drop of VTN+|VTP| in power supply circuit 116. Therefore, the voltage of second power supply node 22 is set to V2+VTN+|VTP|. As a result, reference voltage V25 from reference voltage generation circuit 110 includes VTN+|VTP| as its voltage component.

As shown in FIG. 12, when P channel MOS transistor 10c having its gate and drain connected together is utilized in voltage level determination circuit 112, similarly, added diode-connected P channel MOS transistors 43 and 45 in power supply circuits 116 and 114 respectively allows production of reference voltage V25 capable of preventing the variation in threshold voltage VTP of MOS transistor 10c. As a result, internal voltage V9 can be set at a desired voltage level.

Modification

Figure 13:
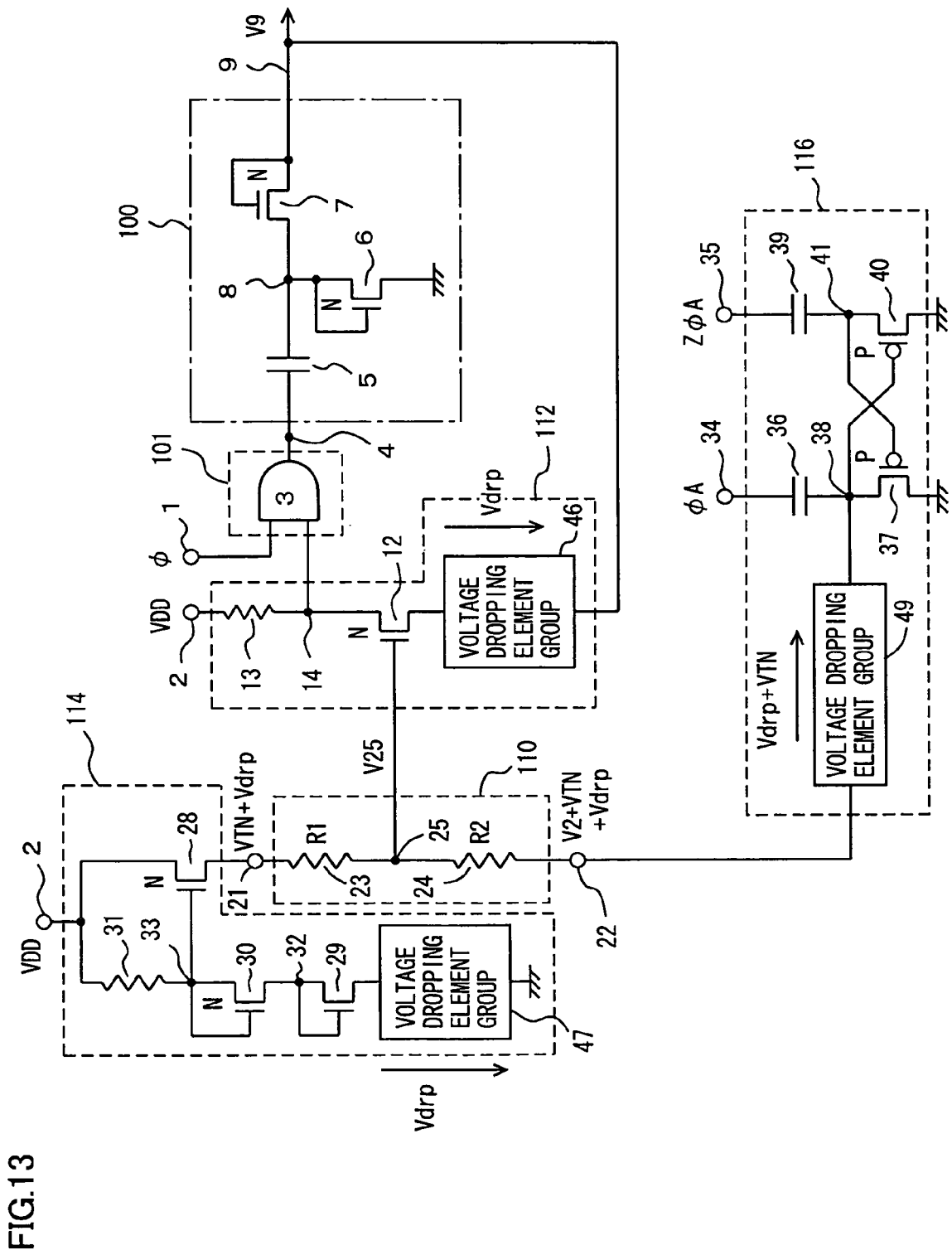
FIG. 13 shows a modification of the seventh embodiment of the present invention.

FIG. 13 shows a modification of the seventh embodiment of the present invention. The internal voltage generation circuit in FIG. 13 is different in configuration from the internal voltage generation circuit in FIG. 10 in the following points. That is, in voltage level determination circuit 112, a voltage dropping element group 46 causing the voltage drop of Vdrp when made conductive, is connected between the source node of MOS transistor 12 and output node 9 of charge pump circuit 100. Similarly, in power supply circuit 114, a voltage dropping element group 47 causing the voltage drop of Vdrp, is connected between node 32 and the ground node. In power supply circuit 116, a voltage dropping element group 49 causing the voltage drop of Vdrp when made conductive, is connected between power supply node 22 and node 38. Voltage dropping element groups 46, 47, and 49 each include diode-connected MOS transistors and/or diode elements connected in series. Voltage dropping element groups 46, 47, and 49 are identical in circuit configuration except for the internal arrangement order of elements.

The remaining configuration of the internal voltage generation circuit in FIG. 13 is the same as that of the internal voltage generation circuit in FIG. 10. Therefore, the same reference numerals are assigned to corresponding portions, and the detailed description thereof will not be repeated.

In power supply circuit 114 shown in FIG. 13, a voltage of 2·VTN+Vdrp is generated at node 33. Therefore, a voltage of VTN+Vdrp is produced at power supply node 21. In addition, a voltage of V2+Vdrp is produced at power supply node 22. Therefore, when voltage dropping element group 46 is provided in voltage level determination circuit 112 and causes the voltage drop of Vdrp when made conductive, the use of voltage dropping element groups 47 and 49 identical in configuration with voltage dropping element group 46 can prevent the variation in threshold voltage or forward voltage drop of the voltage dropping elements in voltage dropping element group 46, so that internal voltage V9 can be set at a desired voltage level.

In voltage dropping element groups 46, 47, and 49, an MOS transistor and the voltage dropping element groups may be arranged in any order.

In the above configuration, when the voltage between the source node of MOS transistor 12 and output node 9 of charge pump circuit 100 attains Vdrp, voltage dropping element group 46 in voltage level determination circuit 112 may be-configured to be conductive and operate in a resistance mode. In such configuration, it is merely required that the voltage level of node 14, when voltage dropping element group 46 and MOS transistor 12 are all rendered conductive in voltage level determination circuit 112, is determined to be "L" level by AND circuit 3.

As described above, according to the seventh embodiment of the present invention, a voltage down-converter similar in configuration to that in voltage level determination circuit 112 is provided in the power supply circuit so that the same voltage drop as that in voltage level determination circuit 112 can be produced therein. Regardless of the configuration of the circuit causing the voltage drop in voltage level determination circuit 112, the influence of the threshold voltage or the like can be accurately cancelled out, so that the internal voltage can be produced at a desired voltage level.

Eighth Embodiment

Figure 14:
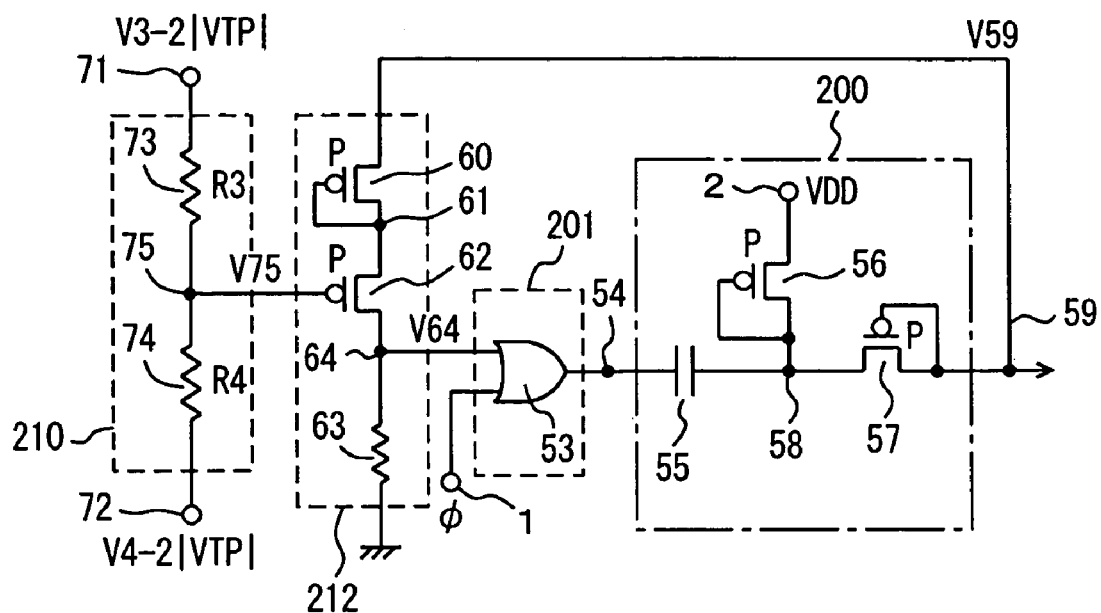
FIG. 14 shows the configuration of an internal voltage generation circuit according to an eighth embodiment of the present invention.

FIG. 14 shows the configuration of an internal voltage generation circuit according to an eighth embodiment of the present invention. The internal voltage generation circuit in FIG. 14 includes a charge pump circuit 200 performing a charge pump operation in accordance with a repetition signal applied to a node 54 to produce a boosted voltage V59 higher than power supply voltage VDD at output node 59, a reference voltage generation circuit 210 for generating a reference voltage V75, a voltage level determination circuit 212 for determining whether the voltage level of boosted voltage V59 is at a prescribed voltage level or higher based on a difference between reference voltage V75 and boosted voltage V59, and a charge pump control circuit 201 selectively applying, via node 54, repetition signal φ applied to clock input node 1 to charge pump circuit 200 in accordance with a determination result from voltage level determination circuit 212.

Charge pump circuit 200 includes a capacitive element 55 connected between nodes 54 and 58, a P channel MOS transistor 56 connected between main power supply node 2 and node 58 and having its gate connected to node 58, and a P channel MOS transistor 57 connected between node 58 and output node 59 and having its gate connected to output node 59.

When the repetition signal is applied to node 54, a charge pump operation of capacitive element 55 changes the voltage level of node 58 in charge pump circuit 200. Node 58 is coupled to power supply node 2 via diode-connected P channel MOS transistor 56. Therefore, MOS transistor 56 clamps the lower-limit voltage of node 58 at a voltage level of VDD−|VTP|. Accordingly, when the amplitude of the repetition signal applied via node 54 is power supply voltage VDD, the voltage of node 58 varies between 2·VDD−|VTP| and VDD−|VTP|. Since MOS transistor 57 functions as a diode, a voltage drop of |VTP| occurs between node 58 and output node 59. Therefore, charge pump circuit 200 is capable of generating, at the maximum, voltage V59 represented by the following equation (16).

$$V59=2 \cdot VDD-2|VTP| \qquad (16)$$

Reference voltage generation circuit 210 includes resistance elements 73 and 74 connected in series between power supply nodes 71 and 72. A voltage of V3−2·|VTP| is applied to power supply node 71, while a voltage of V4−2·|VTP| is applied to power supply node 72. Resistance elements 73 and 74 have resistance values R3 and R4, respectively. Reference voltage V75 is generated from a connection node 75 between resistance elements 73 and 74.

Reference voltage generation circuit 210 resistance-divides the voltages of power supply nodes 71 and 72 to generate reference voltage V75. Therefore, reference voltage V75 is represented by the following equation (17).

$$V75=-2\cdot|VTP|+(R4\cdot V3+R3\cdot V4)/(R3+R4) \quad (17)$$

Therefore, through appropriate setting of resistance values R3 and R4 of resistance elements 73 and 74 and the voltage levels of voltages V1 and V2 in reference voltage generation circuit 210, reference voltage V75 can be generated at a desired voltage level that is not restricted by threshold voltage VTP.

Voltage level determination circuit 212 includes a P channel MOS transistor 60 connected between the output node of charge pump circuit 200 and a node 61 and having its gate connected to node 61, a P channel MOS transistor 62 connected between nodes 61 and 64 and receiving reference voltage V75 at its gate, and a resistance element 63 of high resistance connected between a node 64 and the ground node. MOS transistors 60 and 62 each have threshold voltage VTP.

On-resistances of MOS transistors 60 and 62 are set to a value sufficiently smaller than the resistance value of resistance element 63. MOS transistor 60 operates in a diode mode and causes a voltage drop of |VTP| when made conductive.

Alternatively, the on-resistances of MOS transistors 60 and 62 may be set relatively high, to operate MOS transistor 60 in a resistance mode. Similarly in such a resistance mode, MOS transistors 60 and 62 each turn conductive when the gate-source voltage becomes lower than threshold voltage VTP.

MOS transistor 62 turns conductive when the voltage of node 61 exceeds reference voltage V75 by |VTP|. Therefore, when boosted voltage V59 exceeds reference voltage V75 by 2·|VTP|, MOS transistors 60 and 62 turn conductive to supply a current to resistance element 63, and the level of a voltage V64 of node 64 rises to the H level. When at least one of MOS transistors 60 and 62 is non-conductive, no current is supplied to resistance element 63. Therefore, node 64 is maintained at the ground voltage level by resistance element 63.

Charge pump control circuit 201 includes an OR circuit 53 receiving repetition signal φ applied to clock input node 1 and a voltage V64 on node 64 supplied from voltage level determination circuit 212. An output signal from OR circuit 53 is applied via node 54 to capacitive element 55 of charge pump circuit 200. Voltage V64 of node 64 is used as a signal indicating a result of determination on the boosted voltage level.

When boosted voltage V59 exceeds a voltage of V75+2·|VTP|, the output signal from voltage level determination circuit 212 (voltage V64 of node 64) attains the H level. In response, the output signal from OR circuit 53 is fixed at the H level, and the charge pump operation of charge pump circuit 200 is stopped. When the voltage difference between the voltage of node 58 and boosted voltage V59 from output node 59 is |VTP| in charge pump circuit 200, MOS transistor 57 turns non-conductive, and an operation of supplying positive charges to output node 59 is stopped.

In contrast, when boosted voltage V59 is not higher than the voltage of V75+2·|VTP|, the output signal from voltage level determination circuit 212, or voltage V64 is at the L level, and OR circuit 53 supplies repetition signal φ via node 54 to capacitive element 55 in charge pump circuit 200.

Therefore, the internal voltage generation circuit shown in FIG. 14 generates the voltage of V75+2·|VTP| as boosted voltage V59. Reference voltage V75 contains −2·|VTP| as its voltage component. Therefore, boosted voltage V59 is set at a voltage level determined by the voltages V3 and V4 and resistance values R3 and R4 of resistance elements 73 and 74 independently of threshold voltage VTP. Specifically, the voltage level of boosted voltage V59 is represented by the following equation (18).

$$V59=(R4\cdot V3+R3\cdot V4)/(R3+R4) \quad (18)$$

As shown in FIG. 14, also in the configuration generating boosted voltage V59 higher than power supply voltage VDD, even when MOS transistors 60 and 62 are employed for voltage level detection, boosted voltage V59 will not be influenced by the variation in threshold voltages thereof and can be maintained at a predetermined voltage level. In addition, by setting resistance values R3 and R4 of resistance elements 73 and 74 at appropriate values, boosted voltage V59 can be set at a desired voltage level. In particular, when reference voltage V75 is set at the level of power supply voltage VDD, boosted voltage V59 can accurately be set at a voltage level of 2·|VTP|+VDD.

When the charge pump operation of charge pump circuit 200 is to be ceased, the output signal from charge pump control circuit 201 may be fixed at the L level. In this case, an NOR circuit is employed instead of OR circuit 53. In this configuration, if boosted voltage V59 exceeds a prescribed voltage level, the voltage level of node 58 can be set at a voltage of VDD−|VTP| to prevent the supply of the positive charges from MOS transistor 57 to output node 59, whereby the boosting operation of boosted voltage V59 can be prohibited in a reliable manner.

When the internal voltage generation circuit is used in an image display circuit including a low-temperature polysilicon TFT circuit, MOS transistors 60 and 62 for detection are also formed of TFTs.

Ninth Embodiment

Figure 15:
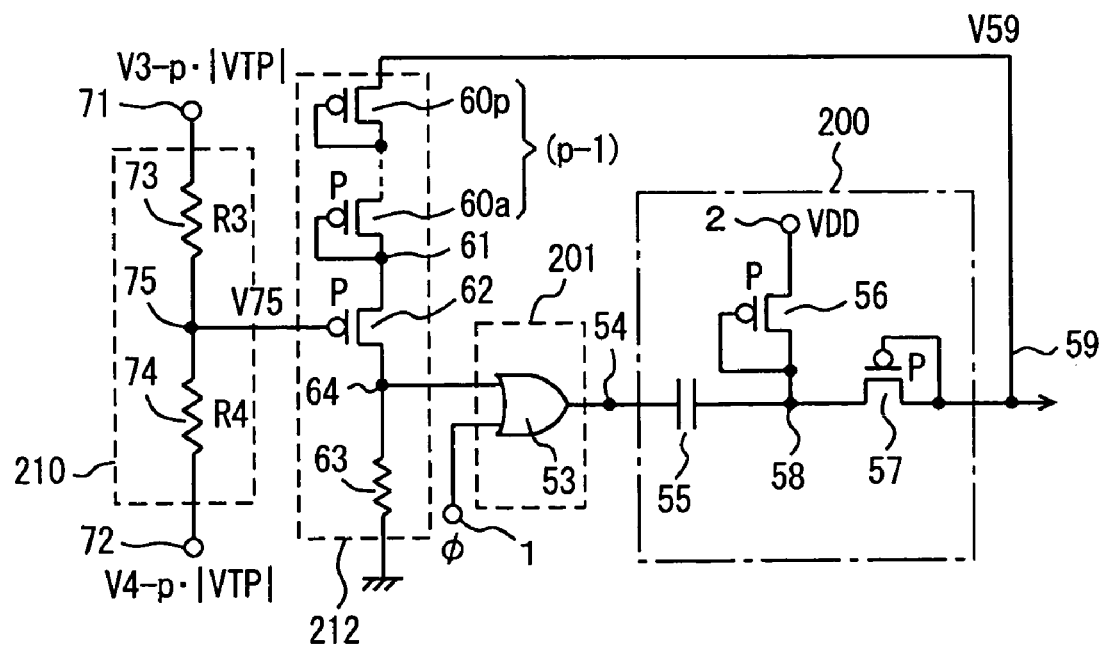
FIG. 15 shows the configuration of an internal voltage generation circuit according to a ninth embodiment of the present invention.

FIG. 15 shows the configuration of an internal voltage generation circuit according to a ninth embodiment of the present invention. The internal voltage generation circuit shown in FIG. 15 is different in configuration from the internal voltage generation circuit in FIG. 14 in the following point. Specifically, in voltage level determination circuit 212, diode-connected or resistance-connected P channel MOS transistors 60a to 60p are further connected in series between source node 61 of MOS transistor 62 and output node 59 of charge pump circuit 200. The total number of MOS transistors 60a to 60n is (p−1). MOS transistors 60a to 60p each have threshold voltage VTP.

In reference voltage generation circuit 210, a voltage of V3−p·|VTP| is applied to power supply node 71, while a voltage of V4−p·|VTP| is applied to power supply node 72. The remaining configuration of the internal voltage generation circuit in FIG. 15 is the same as that of the internal voltage generation circuit in FIG. 14. Therefore, the same reference numerals are assigned to corresponding portions, and the detailed description thereof will not be repeated.

When boosted voltage V59 exceeds reference voltage V75 by at least p·|VTP| in the internal voltage generation circuit in FIG. 15, all MOS transistors 60a to 60p and 62 turn conductive, and a signal of node 64 attains the H level, to stop the charge pump operation of charge pump circuit 200 via charge pump control circuit 201. The voltage level of reference voltage V75 is represented by the following equation (19).

$$V75=-p\cdot|VTP|+(R3\cdot V4+R4\cdot V3)/(R3+R4) \quad (19)$$

Therefore, as in the internal voltage generation circuit shown in FIG. 14, the voltage level of boosted voltage V59 can be set at a level represented by the following equation (20).

$$V59=(V3 \cdot V4+R4 \cdot V3)/(R3+R4) \quad (20)$$

Therefore, in such a case where threshold voltage VTP of the MOS transistor as described above is utilized to determine the voltage level, boosted voltage V59 can be set accurately at a desired voltage level, immune to the variation in threshold voltage VTP and independent of the level of threshold voltage VTP. In particular, when the level of reference voltage V75 is set at power supply voltage VDD, boosted voltage V59 can be set at a voltage level of VDD+p·|VTP|. In this case as well, components of variations of threshold voltages of MOS transistors 62 and 60a to 60p have already been compensated for in reference voltage V75, whereby the boosted voltage can be produced accurately at a desired voltage level.

Even if there is a limitation on a resistance ratio of resistance values R3 and R4 of resistance elements 73 and 74 and voltages V3 and V4, MOS transistors 60a to 60p are used to set the level of the boosted voltage at a level close to a desired voltage level, and then resistance elements 73 and 74 are used to make fine adjustment so that boosted voltage V59 can accurately be set at a desired voltage level.

For the number (p−1) of the series-connected MOS transistors 60a to 60p, p should be at least 1 and is set to an appropriate number in accordance with the voltage level of boosted voltage V59.

As described above, in the configuration in which a plurality of MOS transistors are connected in series to shift down the boosted voltage to detect the level of the boosted voltage, production of the reference voltage having a component for a voltage drop similar to that of the shifting down MOS transistor through resistance-division enables the boosted voltage to be accurately generated at a desired voltage level without being influenced by the threshold voltage.

Tenth Embodiment

Figure 16:
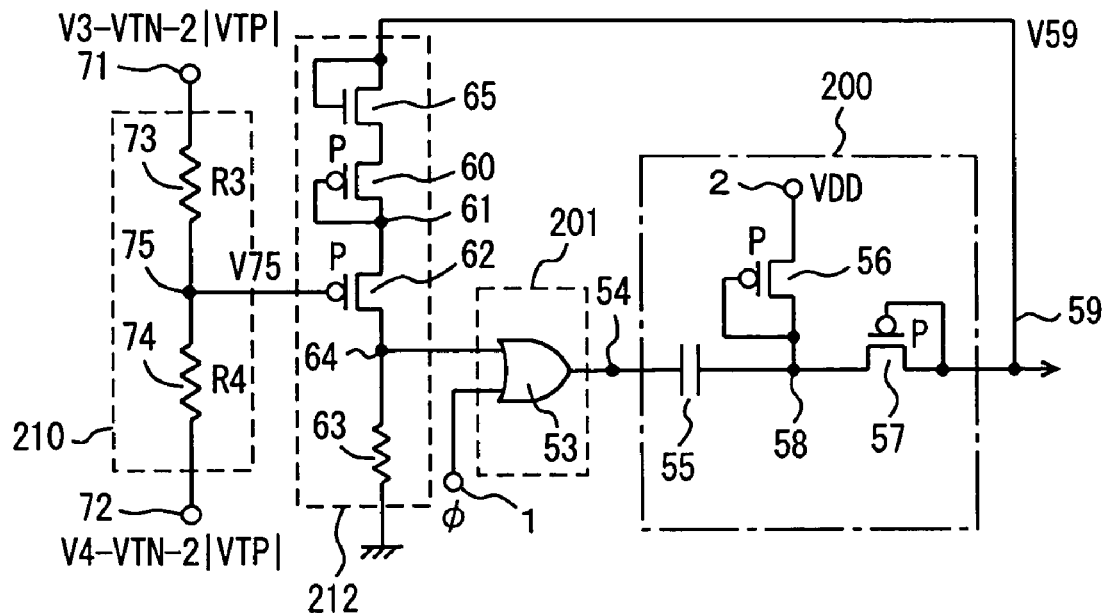
FIG. 16 shows the configuration of an internal voltage generation circuit according to a tenth embodiment of the present invention.

FIG. 16 shows the configuration of an internal voltage generation circuit according to a tenth embodiment of the present invention. The internal voltage generation circuit in FIG. 16 is different in configuration from the internal voltage generation circuit shown in FIG. 14 in the following point. That is, in voltage level determination circuit 212, a further diode-connected or resistance-connected N channel MOS transistor 65 is connected between diode-connected or resistance-connected P channel MOS transistor 60 and output node 59 of charge pump circuit 200.

A voltage of V3−VTN−2·|VTP| is applied to power supply node 71 in reference voltage generation circuit 210. Similarly, a voltage of V4−VTN−2·|VTP| is applied to power supply node 72. The remaining configuration of the internal voltage generation circuit in FIG. 16 is the same as that of the internal voltage generation circuit shown in FIG. 14. Therefore, the same reference numerals are assigned to corresponding portions, and the detailed description thereof will not be repeated.

When a voltage difference between boosted voltage V59 and reference voltage V75 is VTN+2·|VTP| in the configuration of the internal voltage generation circuit shown in FIG. 16, all MOS transistors 65, 60, and 62 turn conductive, and the voltage level of node 64 attains the H level. In response, the output signal from charge pump circuit 201 is fixed at the H level, and the charge pump operation of charge pump circuit 200 is stopped.

Reference voltage V75 is generated at a level set forth below, which level is lower, by the voltage VTN+2·|VTP|, than the voltage obtained by resistance-divided by resistance values R3 and R4 of resistance elements 73 and 74. The voltage of VTN+2·|VTP| is equal to a voltage drop for boosted voltage V59 in voltage level determination circuit 212. Therefore, boosted voltage V59 can be set at a voltage level obtained through resistance-division of voltages V3 and V4 by resistance values R3 and R4. Accordingly, boosted voltage V59 can be set at a desired voltage level without being influenced by the threshold voltage.

In particular threshold voltages VTN and VTP can have the voltage levels set individually. Even when an external factor imposes a limitation on the levels of the voltages V3 and V4 and resistance values R3 and R4, the boosted voltage can stably be produced at a desired voltage level.

When reference voltage V75 is set at power supply voltage VDD, boosted voltage V59 is maintained at a voltage level of VDD+2·|VTP|+VTN.

When the number of diode-connected or resistance-connected N channel MOS transistors is n and the number of diode-connected or resistance-connected P channel MOS transistors is (p−1), the voltages of power supply nodes 71 and 72 are given by the following equations (21) and (22), respectively.

$$V71=V3-n \cdot VTN-p \cdot |VTP| \quad (21)$$

$$V72=V4-n \cdot VTN-p \cdot |VTP| \quad (22)$$

The voltage level of reference voltage V75 can be set at an optimal voltage level in correspondence to the amount of voltage drop between output node 59 of charge pump circuit 200 and the detecting MOS transistor 62.

When reference voltage V75 is set at the level of power supply voltage VDD, a voltage having a voltage level of VDD+n·VTN+p·|VTP| can be obtained as boosted voltage V59.

As described above, according to the tenth embodiment of the present invention, P and N channel MOS transistors are connected in series for shifting down the boosted voltage, and the amount of voltage drop can be adjusted by the individual threshold voltages, whereby the voltage level of the boosted voltage can be set accurately at a desired voltage level. In addition, in this configuration as well, a voltage component corresponding to the amount of voltage drop of the boosted voltage is included in the reference voltage. Accordingly, the variation in threshold voltage can accurately be cancelled out so that the boosted voltage can be produced at a desired voltage level.

Eleventh Embodiment

Figure 17:
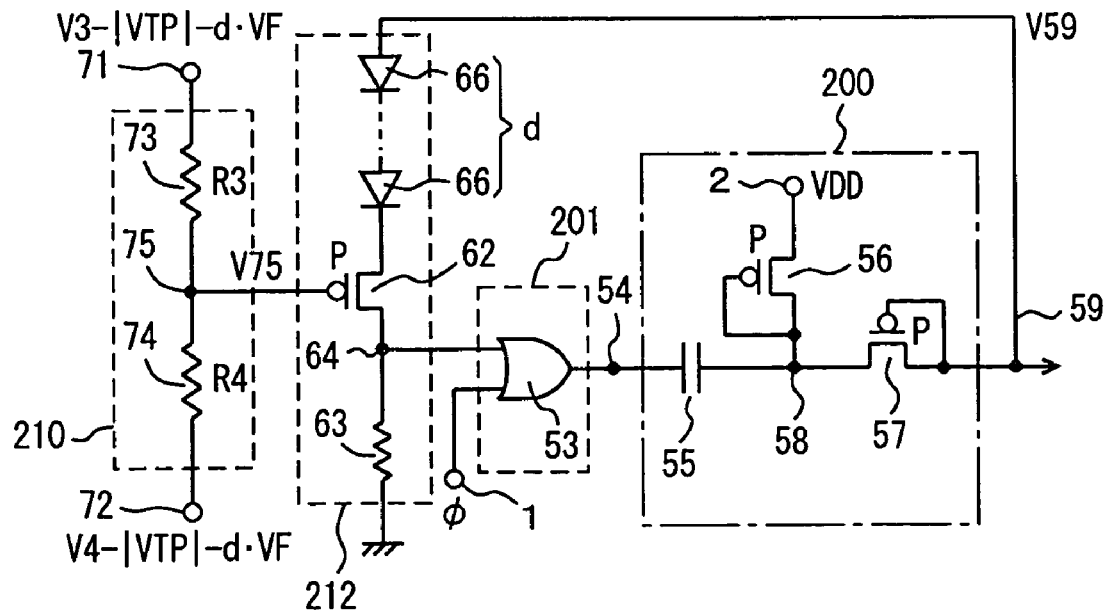
FIG. 17 shows the configuration of an internal voltage generation circuit according to an eleventh embodiment of the present invention.

FIG. 17 shows the configuration of an internal voltage generation circuit according to an eleventh embodiment of the present invention. The internal voltage generation circuit in FIG. 17 includes d diode elements 66 connected in series between output node 59 of charge pump circuit 200 and the source node of MOS transistor 62 in voltage level determination circuit 212, in the forward direction viewed from output node 59. Each diode element 66 has a forward voltage drop VF.

In reference voltage generation circuit 210, a voltage of V3−|VTP|−d·VF is applied to power supply node 71, while a voltage of V4−|VTP|−d·VF is applied to power supply node 72. The remaining configuration of the internal voltage generation circuit in FIG. 17 is the same as that of the internal voltage generation circuit shown in FIG. 16. Therefore, the same reference numerals are assigned to corresponding portions, and the detailed description thereof will not be repeated.

In the configuration of the internal voltage generation circuit in FIG. 17, reference voltage V75 is given by the following equation (23).

$$V75=-|VTP|-d \cdot VF+(R3 \cdot V4+R4 \cdot V3)/(R3+R4) \qquad (23)$$

When a voltage drop of d·VF occurs in d diode elements, d diodes 66 turn conductive. MOS transistor 62 turns conductive when a voltage difference between the gate and the source is at least |VTP|. Therefore, boosted voltage V59 is given by the following equation (24).

$$\begin{aligned} V59 &= V75 + |VTP| + d \cdot VF \\ &= (V3 \cdot R4 + V4 \cdot R3)/(R3 + R4) \end{aligned} \qquad (24)$$

Therefore, boosted voltage V59 can be set at a voltage level dependent on the voltages V3 and V4 and the resistance values R3 and R4 of resistance elements 73 and 74. Accordingly, even if the internal voltage generation circuit is formed of, for example, the TFTs and the variation in threshold voltage is large, boosted voltage V59 can be generated accurately at a desired voltage level in a stable manner.

Modification

Figure 18:
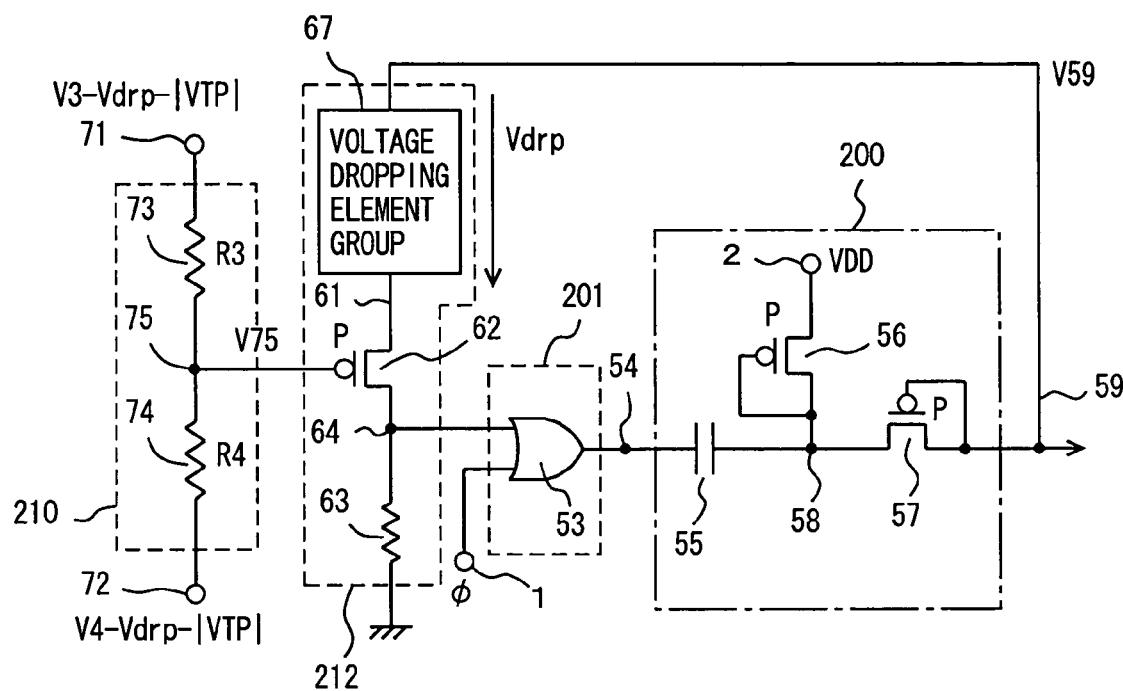
FIG. 18 shows a modification of the eleventh embodiment of the present invention.

FIG. 18 shows the configuration of an internal voltage generation circuit according to a modification of the eleventh embodiment of the present invention. In the configuration of the internal voltage generation circuit shown in FIG. 18, voltage level determination circuit 212 includes a voltage dropping element group 67 arranged between output node 59 of charge pump circuit 200 and source node 61 of P channel MOS transistor 62, which turns conductive when a voltage drop of Vdrp occurs thereacross. Voltage dropping element group 67 is formed of MOS transistors each having its gate and drain connected together and/or a diode element.

In reference voltage generation circuit 210, a voltage of V3−Vdrp is applied to power supply node 71, while a voltage of V4−Vdrp is applied to power supply node 72. The remaining configuration of the internal voltage generation circuit in FIG. 18 is the same as that of the internal voltage generation circuit in FIG. 17. Therefore, the same reference numerals are assigned to corresponding portions, and the detailed description thereof will not be repeated.

In the configuration of the internal voltage generation circuit in FIG. 18, reference voltage V75 is given by the following equation (25).

$$V75=-Vdrp+(R3 \cdot V4+R4 \cdot V3)/(R3+R4) \qquad (25)$$

In voltage dropping element group 67, a diode element, a diode-connected or resistance-connected P channel MOS transistor, and a diode-connected or resistance-connected N channel MOS transistor are appropriately combined to be connected in series. Therefore, boosted voltage V59 has a voltage level higher than reference voltage V75 by voltage Vdrp+|VTP|. Therefore, in this case as well, the voltage level of boosted voltage V59 is given by the following equation (26).

$$V59=(R3 \cdot V4+R4 \cdot V3)/(R3+R4) \qquad (26)$$

When reference voltage V75 is at the voltage level of power supply voltage VDD, boosted voltage V59 is set at a voltage level of VDD+|VTP|+Vdrp. Therefore, in the configuration shown in FIG. 18 as well, the voltage level of boosted voltage V59 can be set at a desired voltage level. In addition, even if the MOS transistor in voltage level determination circuit 212 is formed of the TFT and has a relatively large variation in threshold voltage, the voltage level of boosted voltage V59 can accurately be set at a desired voltage level.

Voltage drop Vdrp in voltage dropping element group 67 is given by the following equation (27) when voltage dropping element group 67 is formed of d diode elements, n diode-connected N channel MOS transistors, and (p−1) diode-connected N channel MOS transistors, for example.

$$Vdrp=d \cdot VF+(p-1) \cdot |VTP|+n \cdot VTN \qquad (27)$$

A voltage reflecting a voltage component of voltage drop Vdrp is applied to each of power supply nodes 71 and 72. As a result, the influence of the variation in threshold voltage of the MOS transistor is suppressed, whereby the voltage level of boosted voltage V59 can accurately be set at a desired voltage level.

Furthermore, boosted voltage V59 can be set at a desired voltage level by resistance values R3 and R4.

Twelfth Embodiment

Figure 19:
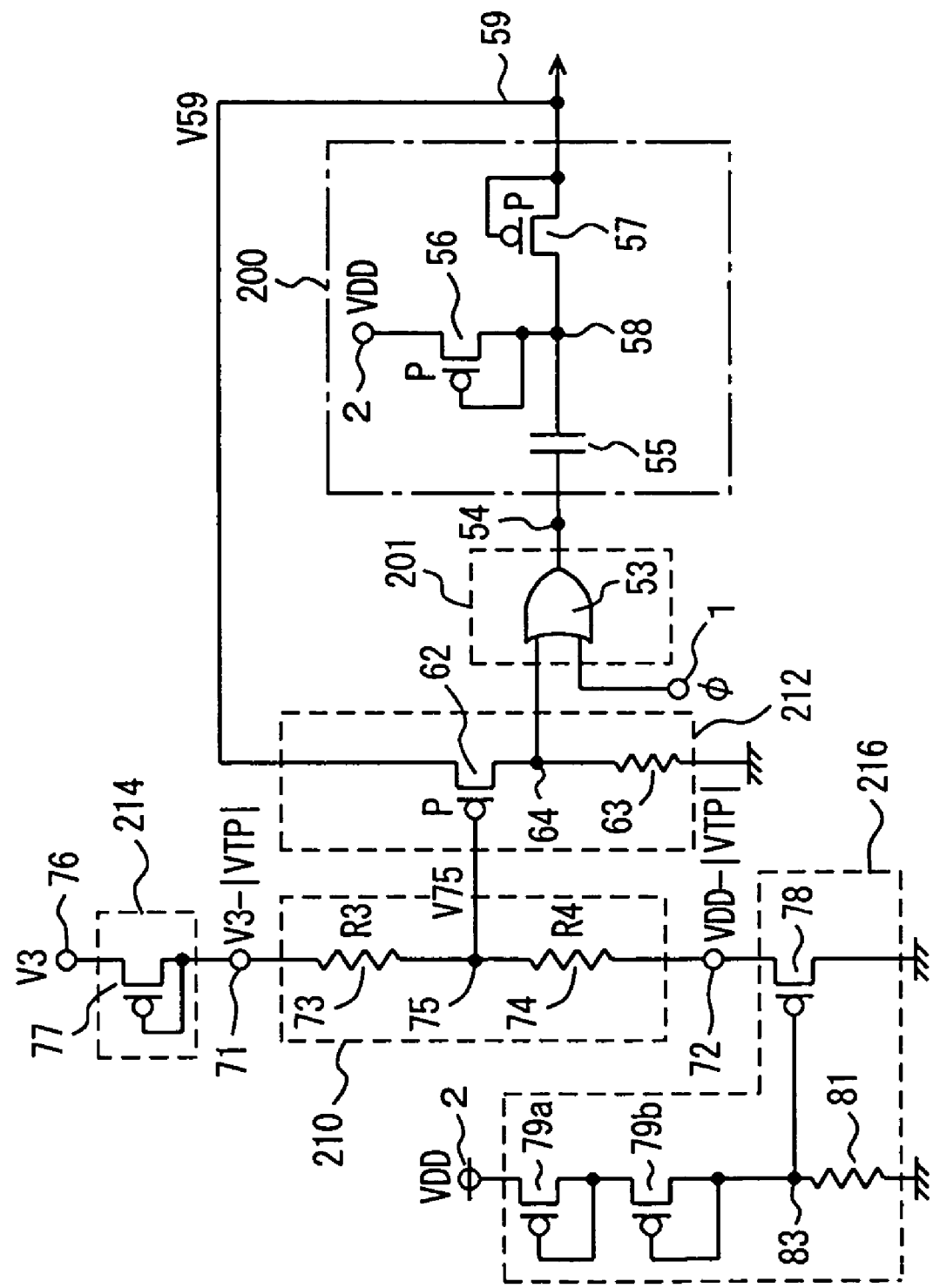
FIG. 19 shows the configuration of an internal voltage generation circuit according to a twelfth embodiment of the present invention.

FIG. 19 shows the configuration of an internal voltage generation circuit according to a twelfth embodiment of the present invention. In the internal voltage generation circuit shown in FIG. 19, voltage level determination circuit 212 includes P channel MOS transistor 62 receiving reference voltage V75 at its gate and connected between the output node of charge pump circuit 200 and node 64 providing an output of a determination result of a voltage level. Therefore, boosted voltage 59 is set at a voltage level of V75+|VTP|.

The configurations of charge pump control circuit 201 and charge pump circuit 200 are the same as those of the circuits shown in the eighth to the eleventh embodiments as described above. Therefore, the same reference numerals are assigned to corresponding portions, and the detailed description thereof will not be repeated.

In reference voltage generation circuit 210, a voltage of V3−|VTP| from a power supply circuit 214 is applied to power supply node 71, while a voltage of VDD−|VTP| from a power supply circuit 216 is applied to power supply node 72. Reference voltage generation circuit 210 resistance-divides the voltages applied to power supply nodes 71 and 72 by resistance elements 73 and 74, to generate reference voltage V75.

Power supply circuit 214 includes a P channel MOS transistor 77 connected between a boosted voltage node 76 and power supply node 71 and having its gate connected to power supply node 71. MOS transistor 77 operates in a diode mode. MOS transistor 77 shifts down, by an absolute value |VTP| of its threshold voltage, a voltage applied to a boosted voltage node 76, and transmits the shifted-down voltage to power supply node 71.

Power supply circuit 216 includes diode-connected P channel MOS transistors 79a and 79b connected in series between main power supply node 2 and a node 83, a resistance element 81 of high resistance connected between node 83 and the ground node, and a P channel MOS transistor 78 connected between power supply node 72 and the ground node and having its gate connected to node 83. MOS transistors 78, 79a, and 79b each have threshold voltage VTP.

Resistance element 81 has a resistance value sufficiently larger than on-resistances of MOS transistors 79a and 79b. MOS transistors 79a and 79b operate in a diode mode. MOS transistors 79a and 79b each cause a voltage drop of |VTP|. Therefore, a voltage of VDD−2·|VTP| is generated at node 83.

MOS transistor 78 turns conductive when the voltage of power supply node 72 exceeds the voltage of node 83 by |VTP|. Therefore, MOS transistor 78 clamps power supply node 72 at the voltage of VDD−|VTP|.

In the configuration shown in FIG. 19, reference voltage V75 is given by the following equation (28).

$$V75 = -|VTP| + (V3 \cdot R4 + R3 \cdot VDD)/(R3+R4) \quad (28)$$

MOS transistor 62 turns conductive when its gate to source voltage is equal to or lower than VTP. Therefore, boosted voltage V59 is given by the following equation (29).

$$\begin{aligned} V59 &= V75 + |VTP| \\ &= (V3 \cdot R4 + VDD \cdot R3)/(R3+R4) \end{aligned} \quad (29)$$

Another voltage-boosting circuit, for example, is utilized to set the voltage level of voltage V3 to a desired voltage level, and the resistance values of resistance elements 73 and 74 are set at appropriate values. As a result, the level of boosted voltage V59 can accurately be set at a desired voltage level without being influenced by the variation in threshold voltage of MOS transistor 62.

By producing the voltage of VDD−|VTP| in internal power supply circuit 216, the variation in threshold voltage of the MOS transistor in power supply circuit 216 can be the same as the variation in threshold voltage of the MOS transistor for detecting the voltage level, whereby the influence of the threshold voltage of the MOS transistor for detecting the voltage level can be cancelled out accurately.

Through adjustment of the number and the polarities of diode-connected MOS transistors connected in series in power supply circuits 214 and 216 in FIG. 19 in accordance with the voltage drop at the MOS transistors for voltage level detection, a voltage adapted for the configuration of the MOS transistor for voltage level detection can be generated as a power supply voltage for reference voltage generation circuit 212.

Thirteenth Embodiment

Figure 20:
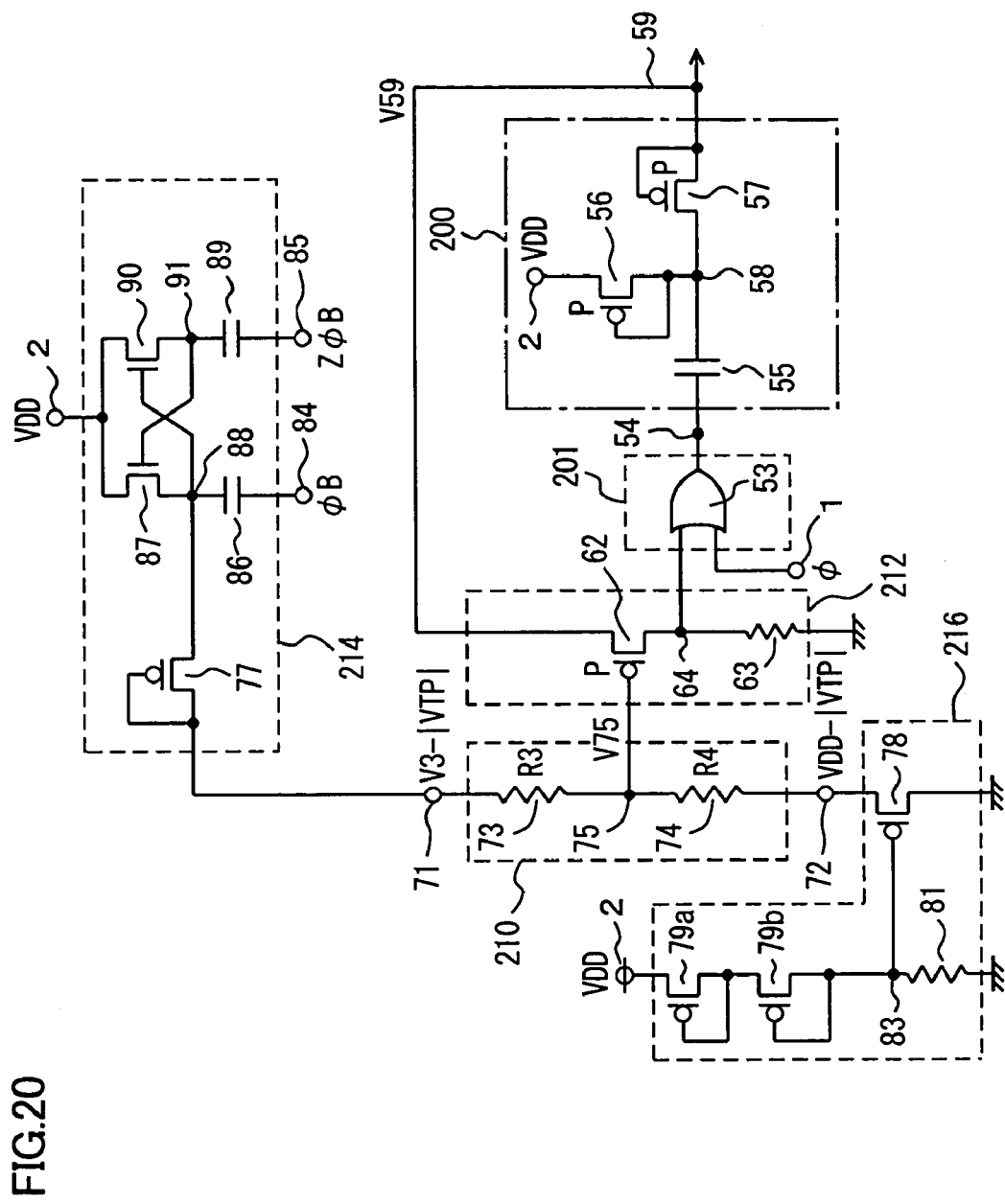
FIG. 20 shows the configuration of an internal voltage generation circuit according to a thirteenth embodiment of the present invention.

FIG. 20 shows the configuration of an internal voltage generation circuit according to a thirteenth embodiment of the present invention. The internal voltage generation circuit shown in FIG. 20 is different in configuration of power supply circuit 214 from the internal voltage generation circuit in FIG. 19.

Power supply circuit 214 includes an N channel MOS transistor 87 connected between main power supply node 2 and a node 88 and having its gate connected to a node 91, an N channel MOS transistor 90 connected between main power supply node 2 and node 91 and having its gate connected to node 88, a capacitive element 86 transmitting a repetition signal φB applied to a clock node 84 to node 88, a capacitive element 89 transmitting a complementary repetition signal ZφB applied to a clock input node 85 to node 91, and diode-connected P channel MOS transistor 77 connected between node 88 and power supply node 71 of reference voltage generation circuit 210 in the forward direction viewed from node 88.

Repetition signals φB and ZφB are signals complementary to each other and their amplitudes are each VB. Amplitude VB has a voltage level higher than threshold voltage VTN. Voltage V3 is given by VDD+VB.

The remaining configuration of the internal voltage generation circuit in FIG. 20 is the same as that of the internal voltage generation circuit in FIG. 19. Therefore, the same reference numerals are assigned to corresponding portions, and the detailed description thereof will not be repeated.

Figure 21:
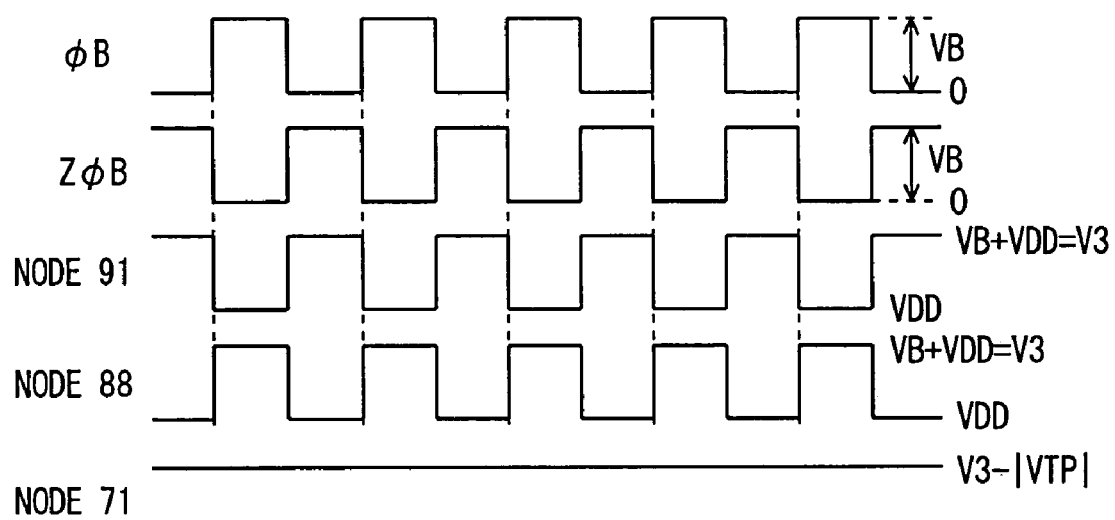
FIG. 21 is a timing diagram representing an operation of a power supply circuit in the internal voltage generation circuit shown in FIG. 20.

FIG. 21 is a signal waveform diagram representing an operation of power supply circuit 214 in FIG. 20. The operation of power supply circuit 214 in FIG. 20 will now be described with reference to FIG. 21.

The amplitudes of repetition signals φB and ZφB are each VB. When repetition signal φB attains the H level, through the charge pump operation of capacitive element 86, the voltage level of node 88 is increased. At this time, repetition signal ZφB falls down to the L level, and responsively the voltage level of node 91 is decreased by capacitive element 89. The voltage level of node 88 is at the H level, MOS transistor 90 turns conductive, and node 91 is clamped at the level of power supply voltage VDD.

Here, amplitude VB of each of repetition signals φB and ZφB has a voltage level higher than threshold voltage VTN. Therefore, when repetition signal φB goes high, the voltage of node 88 increases from its precharged voltage VDD level by the voltage of VB, and the voltage level of node 88 eventually attains a voltage of VB+VDD. MOS transistor 87 receives power supply voltage VDD at its gate and has the power supply node as its source serving. In this state, therefore, MOS transistor 87 remains non-conductive. Voltage VB is higher than threshold voltage VTN and the voltage of node 91 can be reliable precharged to the level of power supply voltage VDD via MOS transistor 90.

If the voltage of power supply node 71 is equal to or lower than VDD+VB−|VTP| when the voltage level of node 88 is at VDD+VB, MOS transistor 77 turns conductive and supplies positive charges to power supply node 71 to increase its voltage level.

In a steady state, the voltage of node 88 changes between power supply voltage VDD and the voltage of VB+VDD, and the voltage of node 91 also changes between voltages VDD and VDD+VB. If the voltage of VB+VDD is assumed to be 3V, a voltage of V3−|VTP| is supplied to power supply node 71 of reference voltage generation circuit 210.

Voltage VB is merely required to have at least a voltage level capable of rendering MOS transistors 87 and 90 conductive to precharge internal nodes 88 and 91 to the power supply voltage level. Therefore, through generation of voltage VB by down-converting power supply voltage VDD to be utilized as the power supply voltage of the circuit producing the repetition signals φB and ZφB, repetition signals φB and ZφB each having amplitude VB can be generated.

By utilizing the internal voltage generation circuit shown in FIG. 20, a voltage of V3−|VTP| can be generated within the semiconductor device. In this case, according to the circuit configuration of power supply circuit 214, the voltage level of voltage V3 is limited by the amplitudes of repetition signals φB and ZφB and the voltage level of power supply voltage VDD. Through setting of resistance values R3 and R4 of resistance elements 73 and 74 to an appropriate ratio, reference voltage V75 can be set at a desired voltage level. Accordingly, the voltage level of boosted voltage V59 can be set at a desired voltage level.

Modification

Figure 22:
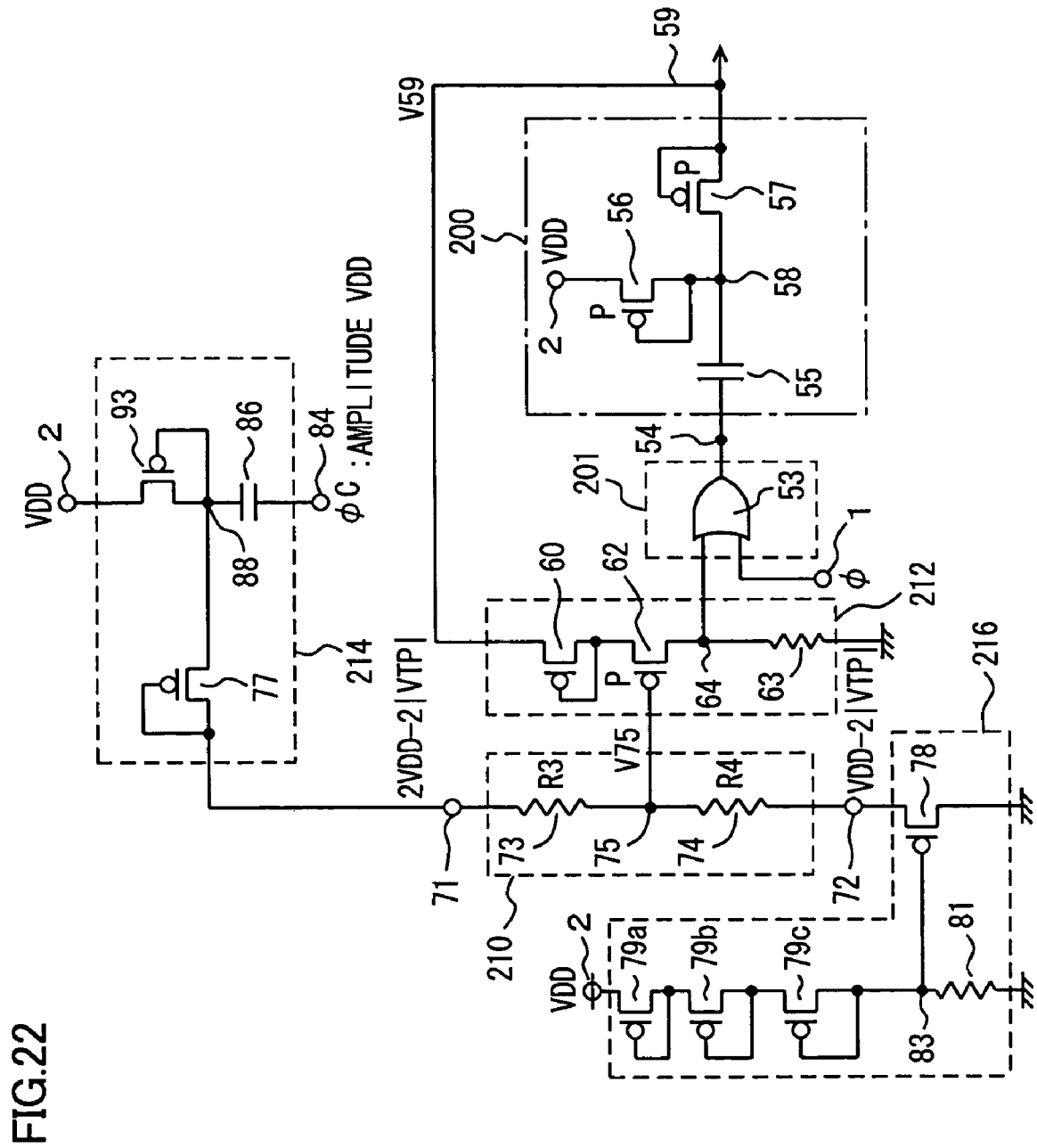
FIG. 22 shows a modification of the thirteenth embodiment of the present invention.

FIG. 22 schematically shows the configuration of a modification of the thirteenth embodiment of the present invention. The internal voltage generation circuit shown in FIG. 22 is different in configuration from the internal voltage generation circuit in FIG. 19 in the following point.

That is, voltage level determination circuit 212 further includes, as a voltage dropping element, a P channel MOS transistor 60 connected between output node 59 of charge pump circuit 200 and MOS transistor 62 and having its gate and drain connected to the source of MOS transistor 62. Therefore, voltage level determination circuit 212 determines whether boosted voltage V59 is at a voltage level of V75+2·|VTP|.

Power supply circuit 214 includes a P channel MOS transistor 93 connected between main power supply node 2 and node 88 and having its gate connected to node 88, capacitive element 86 supplying a charge to node 88 in accordance with a repetition signal φC applied to clock input node 84, and P channel MOS transistor 77 connected between node 88 and power supply node 71 of reference voltage generation circuit 210 and having its gate connected to power supply node 71. Repetition signal φC has an amplitude of VDD.

Power supply circuit 216 includes diode-connected P channel MOS transistors 79a to 79c connected in series between main power supply node 2 and internal node 83, and resistance element 81 of high resistance connected between node 83 and the ground node.

The remaining configuration of the internal voltage generation circuit shown in FIG. 22 is the same as that of the internal voltage generation circuit in FIG. 19. Therefore, the same reference numerals are assigned to corresponding portions, and the detailed description thereof will not be repeated.

In the configuration of the internal voltage generation circuit shown in FIG. 22, repetition signal φC having amplitude VDD is applied to power supply circuit 214. Power supply circuit 214 is the same in configuration as charge pump circuit 200. MOS transistor 93 clamps the lower limit voltage of node 88 at a voltage of VDD−|VTP|. Therefore, the voltage of node 88 changes between VDD−|VTP| and 2·VDD−|VTP|. Since MOS transistor 77 operates as a diode element, the voltage level of power supply node 71 is set at a level of 2·VDD−2·|VTP|.

In power supply circuit 216, on-resistances of MOS transistors 79a to 79c are each sufficiently smaller than the resistance value of resistance element 81. Therefore, MOS transistors 79a to 79c each operate as a diode element and cause a voltage drop of |VTP|. Since MOS transistor 78 operates in a source follower mode, a voltage of VDD−2·|VTP| is supplied to power supply node 72.

Therefore, reference voltage generation circuit 210 produces reference voltage V75 as represented by the following equation (29A).

$$V75=(2\cdot R4+R3)\cdot VDD/(R3+R4)-2\cdot VTP \tag{29A}$$

In voltage level determination circuit 212, MOS transistors 60 and 62 provide a voltage drop of 2·|VTP| to the detected voltage level. Therefore, the voltage level of internal voltage V59 is represented by the following equation (30).

$$V59=VDD(2\cdot R4+R3)/(R3+R4) \tag{30}$$

Therefore, even if repetition signal φC with amplitude VDD is utilized, through setting of resistance values R3 and R4 of resistance elements 73 and 74 at appropriate values, internal voltage V59 can be set at a desired voltage level.

For example, when resistance values R3 and R4 of resistance elements 73 and 74 are equal to each other, internal voltage V59 can be set at a voltage level of 3·VDD/2. In this case, since a voltage 1.5 times a memory array power supply voltage is generally used as a boosted voltage for driving a word line in a DRAM, boosted voltage V59 can be utilized to produce a word line driving signal for driving a selected word line in a DRAM of a boosted word line driving scheme.

As described above, according to the thirteenth embodiment of the present invention, with the voltage drop in voltage detection taken into consideration, the power supply voltage to the reference voltage generation circuit is generated internally. As a result, the reference voltage can be produced at a desired voltage level in a stable manner, and thus the boosted voltage can stably be generated.

Fourteenth Embodiment

Figure 23:
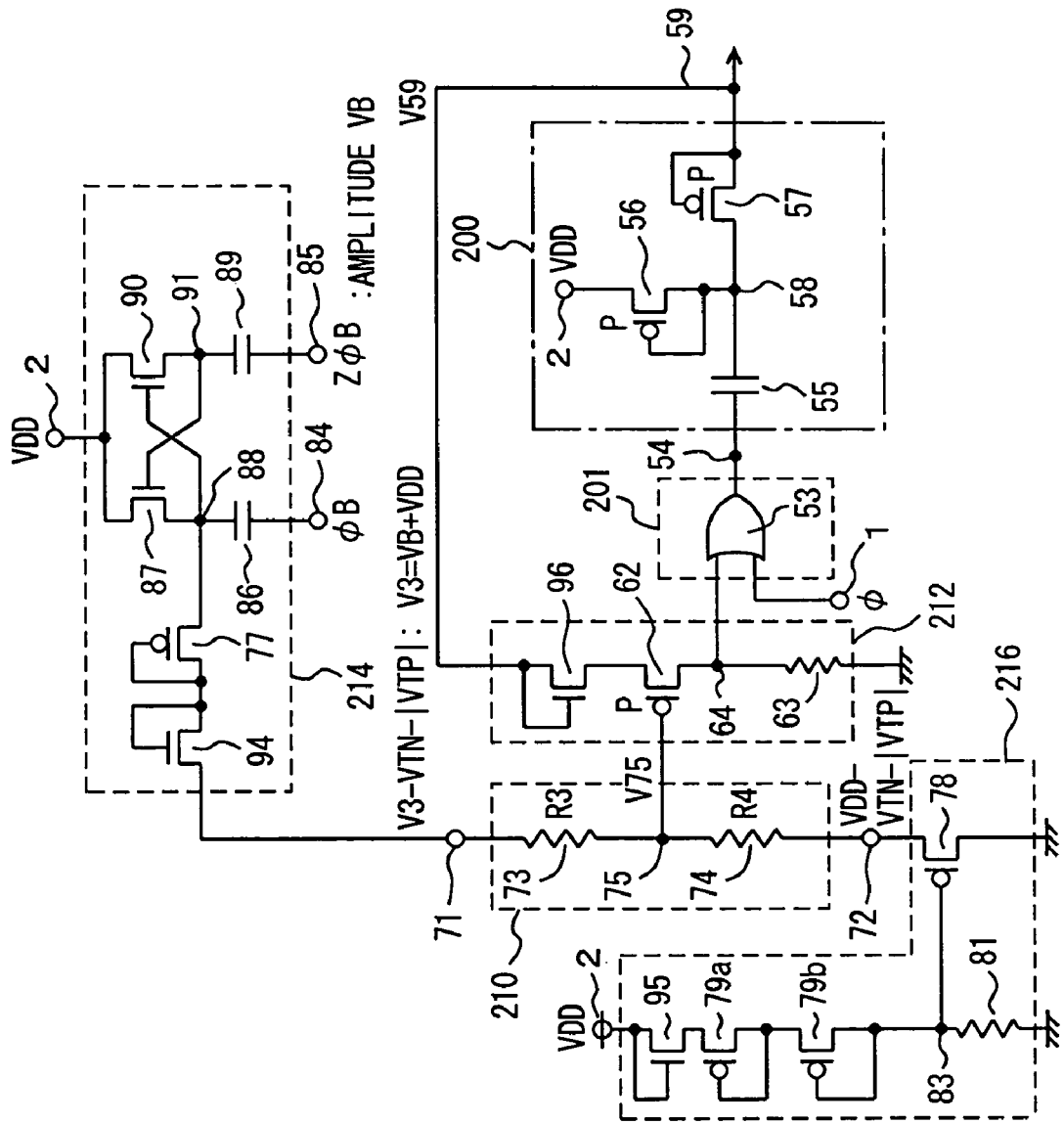
FIG. 23 shows the configuration of an internal voltage generation circuit in accordance with a fourteenth embodiment of the present invention.

FIG. 23 shows the configuration of an internal voltage generation circuit according to a fourteenth embodiment of the present invention. The internal voltage generation circuit shown in FIG. 23 is different in configuration from the internal voltage generation circuit in FIG. 20 in the following point.

That is, voltage level determination circuit 212 further includes a diode-connected N channel MOS transistor 96 connected between P channel MOS transistor 62 and output node 59 of charge pump circuit 200. The on-resistance of N channel MOS transistor 96 is sufficiently made smaller than the resistance value of resistance element 63. N channel MOS transistor 96 operates in a diode mode when made conductive to cause a voltage drop of VTN in boosted voltage V59 for transmission to the source of MOS transistor 62.

Power supply circuit 214 includes a diode-connected N channel MOS transistor 94 connected between P channel MOS transistor 77 and power supply node 71 of reference voltage generation circuit 210. N channel MOS transistor 94 operates in a diode mode when made conductive, to cause the voltage drop of VTN in a path of from MOS transistor 77 to power supply node 71.

Power supply circuit 216 includes a diode-connected N channel MOS transistor 95 connected between main power supply node 2 and P channel MOS transistor 79a. N channel MOS transistor 95 has its gate and drain connected to main power supply node 2, and operates in a diode mode to cause the voltage drop of VTN.

The remaining configuration of the internal voltage generation circuit in FIG. 23 is the same as that of the internal voltage generation circuit in FIG. 20. Therefore, the same reference numerals are assigned to corresponding portions, and the detailed description thereof will not be repeated.

In power supply circuit 214 shown in FIG. 23, repetition signals φB and ZφB each have amplitude VB. The voltage of node 88 changes between power supply voltage VDD and VB+VDD. Therefore, a voltage of VB+VDD−VTN−|VTP|=V3−VTN−|VTP| is supplied to power supply node 71 of reference voltage generation circuit 210.

In contrast, in power supply circuit 216, MOS transistor 95 causes the voltage drop of VTN, and MOS transistors 79a and 79b cause a voltage drop of 2·|VTP|. Therefore, a voltage of VDD−VTN−|VTP| is generated at the source node of MOS transistor 78, or at power supply node 72 of reference voltage generation circuit 210. In this configuration, reference voltage V75 is given by the following equation (31).

$$V75=-VTN-|VTP|+(R3\cdot VDD+R4\cdot V3)/(R3+R4) \tag{31}$$

MOS transistors 62 and 96 in voltage level determination circuit 212 cause a voltage drop of VTN+|VTP|. Therefore, the first and second terms in the right side of the above equation (31) are cancelled out, and the voltage level of boosted voltage V59 can be set at a desired level by the voltages V3 and VDD and the resistance values R3 and R4.

In the configuration of the internal voltage generation circuit shown in FIG. 23, MOS transistors 95, 79a, and 79b in power supply circuit 216 may be connected in any order. Similarly, the positions of MOS transistors 77 and 94 in power supply circuit 214 may be replaced.

Amplitude VB of each of repetition signals φB and ZφB is required to be at least the voltage VTN. Even if nodes 88 and 91 are each at a voltage level lower than power supply voltage VDD in the initial state, when the voltages of nodes 88 and 91 are increased through precharging by transistors 87 and 90 to be precharged to VDD−VTN, nodes 88 and 91 are each charged to VB+VDD−VTN, and thereafter, the precharge voltage levels of nodes 88 and 91 become power supply voltage VDD. Thereafter, the voltages of nodes 88 and 91 each change between VDD and VDD+VB. Therefore, in this state, both MOS transistors 77 and 94 are rendered conductive so that a voltage at a desired voltage level can be supplied to power supply node 71 of reference voltage generation circuit 210.

As the configurations of power supply circuits 214 and 216, any of the configurations of the previously described internal circuits according to the seventh to the twelfth embodiments can be employed as long as the threshold voltage of the voltage dropping MOS transistor in voltage level determination circuit 212 is configured not to influence the voltage level of internal voltage V59.

As described above, even when P and N channel MOS transistors are employed for voltage level detection, the boosted voltage can be generated accurately at a desired voltage level by employing, in the power supply circuit, the configuration same as those of the above-mentioned voltage level detection transistors and further using, in the power supply circuit, the repetition signal with a controlled amplitude to produce the power supply voltage to the reference voltage generation circuit.

Fifteenth Embodiment

Figure 24:
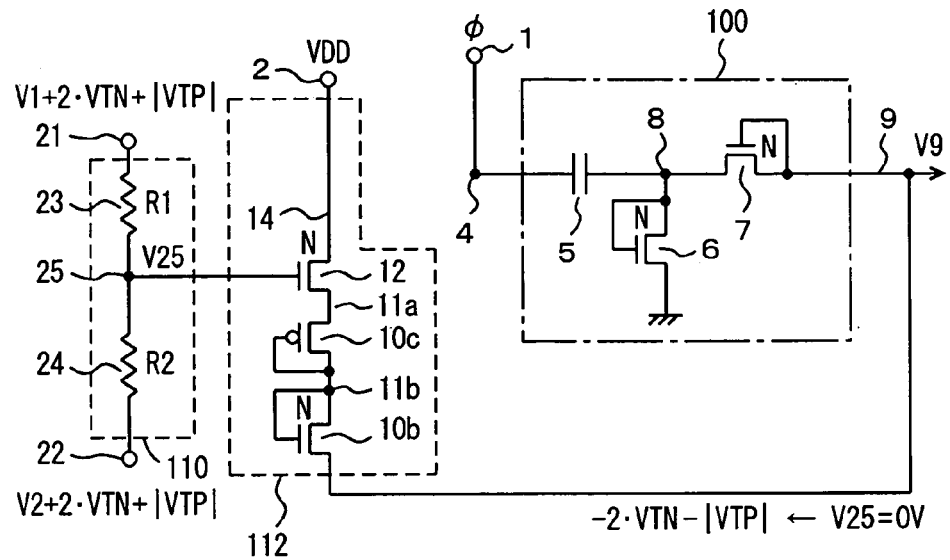
FIG. 24 shows the configuration of an internal voltage generation circuit according to a fifteenth embodiment of the present invention.

FIG. 24 shows the configuration of an internal voltage generation circuit according to a fifteenth embodiment of the present invention. The internal voltage generation circuit in FIG. 24 corresponds in configuration to the internal voltage generation circuit in FIG. 6, but is different in configuration from the internal voltage generation circuit shown in FIG. 6. That is, repetition signal φ is normally applied from clock input node 1 via node 4 to capacitive element 5 in charge pump circuit 100. Therefore, charge pump circuit 100 normally performs the charge pump operation.

In voltage level determination circuit 112, a drain node 14 of N channel MOS transistor 12 for voltage level detection is coupled to main power supply node 2. A source node 11a of MOS transistor 12 is connected to diode-connected P channel MOS transistor 10c. Diode-connected MOS transistor 10b is connected between MOS transistor 10c and the output node of charge pump circuit 100. When MOS transistors 10b and 10c turn conductive, a voltage drop of VTN+|VTP| occurs between node 11a and output node 9.

The remaining configuration of the internal voltage generation circuit in FIG. 24 is the same as that of the internal voltage generation circuit in FIG. 6. Therefore, the same reference numerals are assigned to corresponding portions, and the detailed description thereof will not be repeated.

When a voltage difference between internal voltage V9 produced by charge pump circuit 100 and reference voltage V25 generated by reference voltage generation circuit 110 attains 2·VTN+|VTP|, MOS transistors 12, 10c, and 10b turn conductive. In this state, a current is supplied from main power supply node 2 to output node 9 of charge pump circuit 100 so that the voltage level of internal voltage V9 increases.

When internal voltage V9 exceeds V25−2·VTN−|VTP|, at least one of MOS transistors 12, 10c, and 10b is turned off, and a current flowing path from main power supply node 2 to output node 9 of charge pump circuit 100 is cut off.

Therefore, in the configuration of the internal voltage generation circuit in FIG. 24, the lower-limit voltage level of output voltage V9 from charge pump circuit 100 can be clamped, and the voltage variation in internal voltage V9 can be inhibited.

Therefore, in the application in which charge pump circuit 100 normally operates and low power consumption is not so strongly required, internal voltage V9 having a stable voltage level can be supplied.

In this configuration as well, even if the threshold voltages of MOS transistors 12, 10c, and 10b for voltage level detection vary due to variation of manufacturing parameters, the variation in threshold voltages can be cancelled out, and internal voltage V9 can be set at a desired voltage level.

Modification

Figure 25:
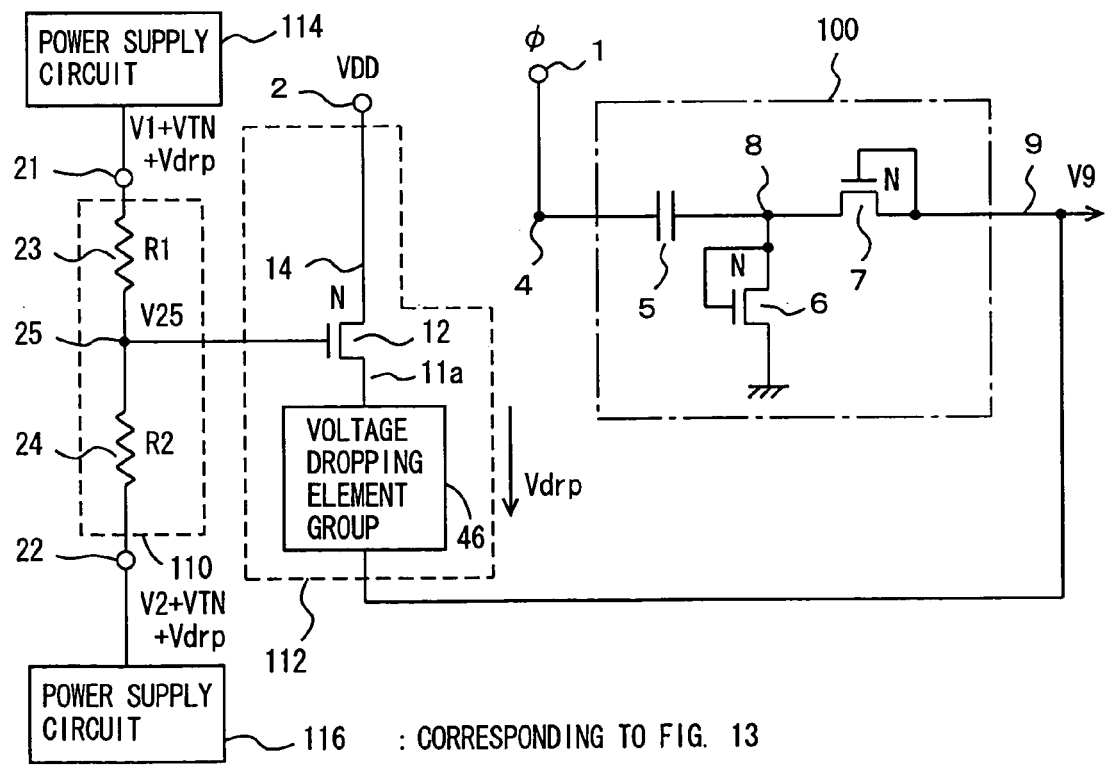
FIG. 25 shows the configuration of a modification of the fifteenth embodiment of the present invention.

FIG. 25 shows the configuration of a modification of the fifteenth embodiment of the present invention. The internal voltage generation circuit in FIG. 25 corresponds in configuration to the internal voltage generation circuit in FIG. 13. Repetition signal φ is normally applied from clock input node 1 via node 4 to charge pump circuit 100. As in the configuration of voltage level determination circuit 112 shown in FIG. 24, a drain node 14 of the detecting MOS transistor 12 is coupled to main power supply node 2. Voltage dropping element group 46 causing the voltage drop of Vdrp when made conductive is connected between a source node 11a of MOS transistor 12 and an output node 9 of charge pump circuit 100. Series-connected voltage dropping elements in voltage dropping element group 46 are each formed of a diode or an MOS transistor operating in a diode mode. For the internal configuration of voltage dropping element group 46, any of the configurations according to the previously-described first to the sixth embodiments can be employed.

In reference voltage generation circuit 110, a voltage of V1+VTN+Vdrp is applied from power supply circuit 114 to power supply node 21, while a voltage of V2+VTN+Vdrp is applied from power supply circuit 116 to power supply node 22. The remaining configuration of the internal voltage generation circuit in FIG. 25 is the same as that of the internal voltage generation circuit in FIG. 24. Therefore, the same reference numerals are assigned to corresponding portions, and the detailed description thereof will not be repeated.

In the configuration of the internal voltage generation circuit in FIG. 25 as well, when output voltage V9 from charge pump circuit 100 is lower than a voltage of V25−VTN−Vdrp, a current flowing path is formed in MOS transistor 12 and voltage dropping element group 46. Responsively, a current is supplied from main power supply node 2 to output node 9 of charge pump circuit 100, and the voltage level of internal voltage V9 increases.

In contrast, when the voltage level of internal voltage V9 is not lower than V25−VTN−Vdrp, the current flowing path is cut off in MOS transistor 12 and voltage dropping element group 46, and the voltage level of internal voltage V9 is decreased by charge pump circuit 100.

Power supply circuits 114 and 116 each have a circuit portion with a topology similar to that of voltage dropping element group 46 and MOS transistor 12 so that the influence of the threshold voltage and/or the forward voltage drop of a voltage dropping element in voltage dropping element group 46 can be cancelled out (see FIG. 13).

Therefore, even if the threshold voltage/the forward drop voltage of voltage dropping element group 46 and the threshold voltage of MOS transistor 12 vary, the voltage level of internal voltage V9 can accurately be maintained at a prescribed voltage level in the configuration shown in FIG. 25 as well, and the variation in voltage level of internal voltage V9 can be inhibited.

Sixteenth Embodiment

Figure 26:
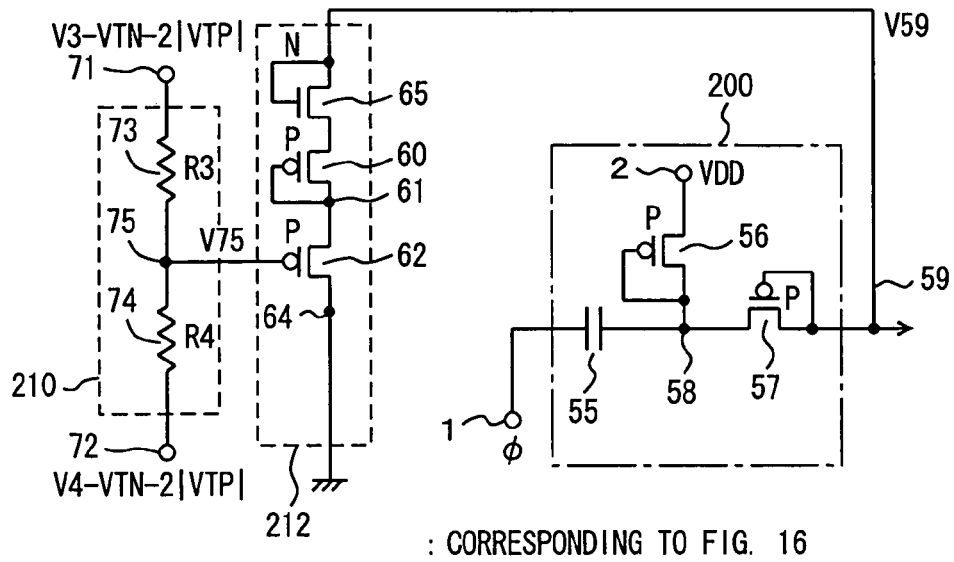
FIG. 26 shows the configuration of an internal voltage generation circuit according to a sixteenth embodiment of the present invention.

FIG. 26 shows the configuration of an internal voltage generation circuit according to a sixteenth embodiment of the present invention. The internal voltage generation circuit in FIG. 26 corresponds in configuration to the internal voltage generation circuit in FIG. 16. Charge pump circuit 200 normally receives a repetition signal φ via clock input node 1 and performs the charge pump operation to generate internal voltage V59. Charge pump circuit 200 is the same in configuration as charge pump circuit 200 in FIG. 16. Therefore, the same reference numerals are assigned to corresponding portions, and the detailed description thereof will not be repeated.

In the internal voltage generation circuit shown in FIG. 26, a drain node 64 of P channel MOS transistor 62 for voltage level detection is coupled to the ground node. Diode-connected MOS transistors 65 and 60 are connected in series between output node 59 of charge pump circuit 200 and source node 61 of MOS transistor 62. MOS transistors 65 and 60 are N and P channel MOS transistors, respectively, and cause voltage drops of VTN and |VTP| when made conductive.

Reference voltage generation circuit 210 is the same in configuration as the reference voltage generation circuit shown in FIG. 16. Voltages V3−VTN−2·|VTP| and V4−VTN−2·|VTP| applied to power supply nodes 71 and 72 respectively are resistance-divided by resistance elements 73 and 74 to generate reference voltage V75.

When internal voltage V59 exceeds voltage V75+ 2·|VTP|+VTN in the configuration of the internal voltage generation circuit in FIG. 26, MOS transistors 65, 60, and 62 turn conductive, and a current flows from output node 59 of charge pump circuit 200 to the ground node so that the voltage level of internal voltage (boosted voltage) V59 decreases. When a voltage difference between boosted voltage V59 and reference voltage V75 is smaller than 2·|VTP|− VTN, at least one of MOS transistors 65, 60, and 62 is non-conductive. In this state, charge pump circuit 200 performs the charge pump operation in accordance with repetition signal φ to generate boosted voltage V59.

Therefore, in this configuration as well, the upper limit of boosted voltage V59 can be clamped at a voltage level of (V3·R4+V4·R3)/(R3+R4), and the voltage variation in boosted voltage V59 can be inhibited. Therefore, in the application in which charge pump circuit 200 normally operates and a low power consumption feature is not required, boosted voltage V59 can stably be maintained at a desired voltage level.

The power supply voltage for reference voltage generation circuit 210 is generated such that the influence of the threshold voltages of MOS transistors 65, 60, and 62 can be cancelled out in the power supply circuits supplying voltages to power supply nodes 71 and 72. Accordingly, boosted voltage V59 can be maintained at a desired voltage level without being influenced by the variation in threshold voltage.

Modification

Figure 27:
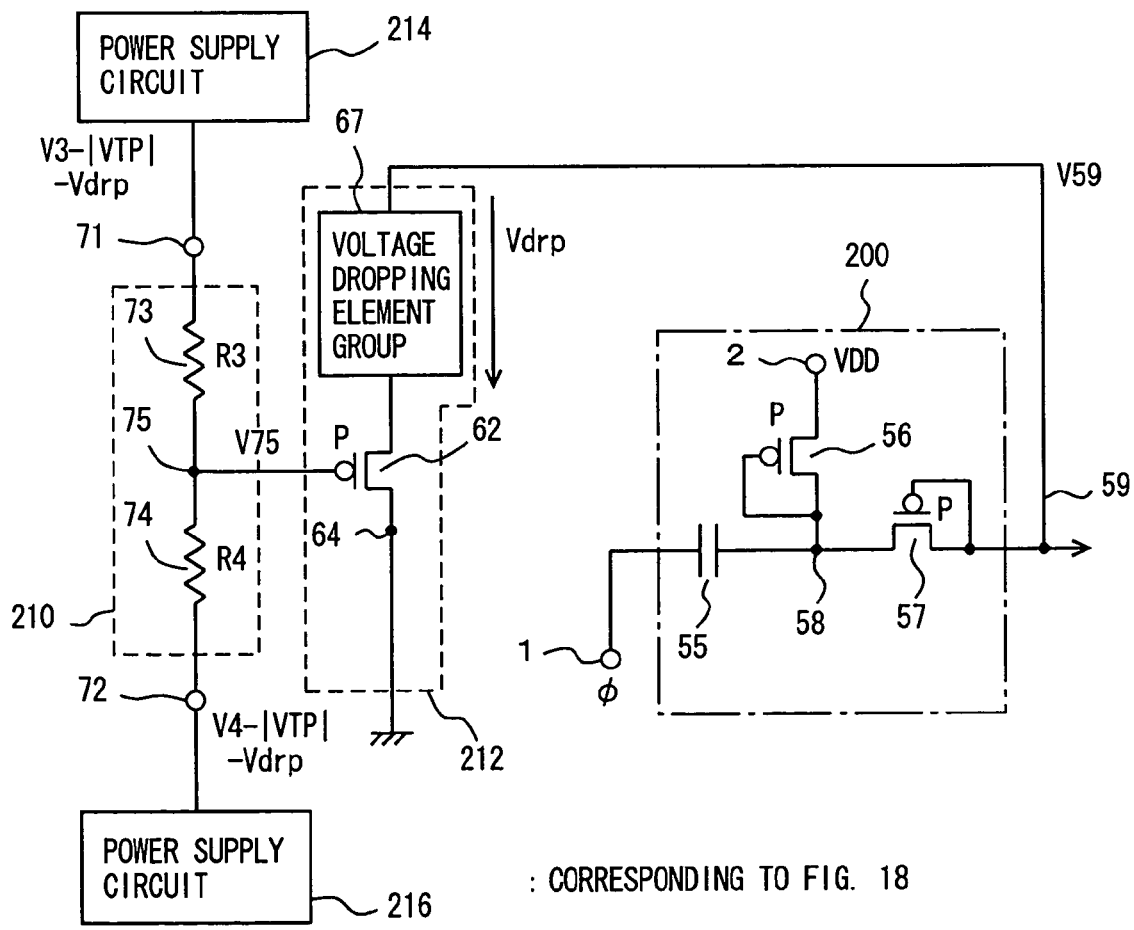
FIG. 27 shows a modification of the sixteenth embodiment of the present invention.

FIG. 27 illustrates the configuration of a modification of the sixteenth embodiment of the present invention. The internal voltage generation circuit in FIG. 27 corresponds in configuration to the internal voltage generation circuit in FIG. 18, but is different in configuration from the corresponding circuit in FIG. 18 in the following point. That is, repetition signal φ is normally applied from clock input node 1 to charge pump circuit 200, and the charge pump operation is performed to produce internal voltage V59.

In voltage level determination circuit 212, drain node 64 of MOS transistor 62 for detection is directly coupled to the ground node. The source of MOS transistor 62 is coupled to output node 59 of charge pump circuit 200 via voltage dropping element group 67. As in the configuration shown in FIG. 18, voltage dropping element group 67 is formed of a diode element or a diode-connected MOS transistor and causes the voltage drop of Vdrp when made conductive.

The remaining configuration of the internal voltage generation circuit in FIG. 27 is the same as that of the internal voltage generation circuit in FIG. 18. Therefore, the same reference numerals are assigned to corresponding portions, and the detailed description thereof will not be repeated.

In the configuration of the internal voltage generation circuit in FIG. 27, charge pump circuit 200 normally performs the charge pump operation to produce boosted voltage V59. When boosted voltage V59 exceeds reference voltage V75 generated by reference voltage generation circuit 210 by |VTP|+Vdrp, all the voltage dropping elements in voltage dropping element group 67 turn conductive, and MOS transistor 62 also turns conductive. A current flows from the output node 59 of charge pump circuit 200 to the ground node, and the voltage level of boosted voltage V59 decreases. In contrast, if a voltage difference between boosted voltage V59 and reference voltage V75 is smaller than |VTP|+Vdrp, at least one voltage dropping element in voltage dropping element group 67 and MOS transistor 62 is non-conductive, and a current flowing path from charge pump circuit 200 to the ground node is cut off.

Therefore, in the configuration shown in FIG. 27 as well, the increase in voltage level of boosted voltage V59 can be inhibited, and the boosted voltage can be produced at a desired voltage level in a stable manner. In addition, as in the configuration of the internal voltage generation circuit shown in FIG. 18, reference voltage V75 contains the voltage components of the threshold voltage and the forward voltage drop of voltage dropping element group 67 and MOS transistor 62 for detection. Therefore, even if these voltage components vary, their influences can be cancelled out and boosted voltage V59 can accurately be set at a desired voltage level.

It is to be understood that the embodiments disclosed herein are illustrative in all aspects and are not to be taken by way of limitation. The scope of the present invention is not defined by the above description, but by the appended claims, and it is intended to cover all the modifications within the meaning and scope equivalent to the appended claims.

INDUSTRIAL APPLICABILITY

In the previously described configurations, the charge pump circuit is formed of one charge pump capacitive element and two diode-connected MOS transistors. The present invention, however, is also applicable to any circuit utilizing a charge pump operation of a capacitive element to generate an internal voltage.

The configurations of the voltage level determination circuit, the reference voltage generation circuit, and the power supply circuit according to the present invention can be applied, not only to the internal voltage generation circuit, but also to a voltage detection circuit detecting the voltage level of the internal voltage. That is, the present invention is applicable to a circuit using a voltage drop characteristic of a semiconductor element to detect a difference between a reference voltage and a target voltage.

Specifically, the present invention is applicable to a word line drive voltage generation circuit, a substrate bias voltage generation circuit of a memory array, and a negative voltage generation circuit in a DRAM. The present invention is also applicable to a circuit generating a write/erasure voltage in a non-volatile semiconductor memory device such as a flash memory.

In addition, the present invention is applicable to a circuit generating a gate drive voltage for driving a TFT pixel drive transistor in a TFT active matrix circuit.

The present invention is generally applicable to an internal voltage generation circuit and a voltage detection circuit in a semiconductor device that includes an MOS transistor as the component thereof and internally generates a voltage different in voltage level from the power supply voltage.

The invention claimed is:

1. Internal voltage generation circuitry comprising:
   a charge pump circuit performing a charge pump operation in accordance with a repetition signal, to produce an internal voltage at an output node;
   a voltage level detection circuit for detecting whether said internal voltage reaches a predetermined voltage level on the basis of a difference between a reference voltage and said internal voltage, said voltage level detection circuit including at least a detection transistor formed of an insulated gate field effect transistor receiving said reference voltage at a gate thereof and selectively rendered conductive in accordance with the difference between said reference voltage and said internal voltage; and
   a reference voltage generation circuit for generating said reference voltage such that an influence of at least a threshold voltage of said detection transistor on a detection of the difference between said reference voltage and said internal voltage is cancelled out.

2. The internal voltage generation circuitry according to claim 1, further comprising a pump control circuit for selectively stopping the pump operation of said charge pump circuit in accordance with a result of detection from said voltage level detection circuit.

3. The internal voltage generation circuitry according to claim 1, wherein said voltage level detection circuit selectively causes a flow of current between said output node and a power supply node through said detection transistor in accordance with the detection result.

4. The internal voltage generation circuitry according to claim 1, wherein
   said voltage level detection circuit further includes at least one dropping element connected between said detection transistor and said output node, said voltage dropping element changing, by a voltage drop caused therein, a voltage level of said internal voltage to be detected, and
   said reference voltage generation circuit generates said reference voltage such that a difference between said predetermined voltage level and said reference voltage is equal to a sum of an absolute value of the threshold voltage of said detection transistor and the voltage drop caused by said voltage dropping element.

5. The internal voltage generation circuitry according to claim 4, wherein
   said reference voltage generation circuit includes a resistance type voltage divider connected between a first power supply node receiving a voltage including, as a voltage component, voltages respectively equal to the absolute value of the threshold voltage of said detection transistor and the voltage drop caused by said voltage dropping element, and a second power supply node receiving a voltage including, as a voltage component, voltages respectively equal to the absolute value of said threshold voltage and the voltage drop caused by said voltage dropping element, and
   said reference voltage is provided by a resistance-divided version of the voltages of the first and second power supply nodes.

6. The internal voltage generation circuitry according to claim 4, wherein said at least one voltage dropping element includes an insulated gate field effect transistor having a control electrode and one conduction node thereof connected together.

7. The internal voltage generation circuitry according to claim 6, wherein said at least one voltage dropping element includes a plurality of series-connected insulated gate field effect transistors each having one conduction node and a control electrode node connected together.

8. The internal voltage generation circuitry according to claim 7, wherein said plurality of insulated gate field effect transistors are identical in conductivity type.

9. The internal voltage generation circuitry according to claim 7, wherein said plurality of insulated gate field effect transistors include transistors different in conductivity type.

10. The internal voltage generation circuitry according to claim 4, wherein said voltage dropping element includes a diode element.

11. Voltage detection circuitry for detecting a level of an internal voltage on an internal node, comprising:
    a first resistance element connected between a first power supply node and an output node;
    a second resistance element connected between a second power supply node and said output node, a voltage of said output node being produced as a reference voltage by dividing a voltage between the first and second power supply nodes through the first and second resistance elements; and
    a voltage level determination circuit for detecting whether said internal voltage reaches a prescribed voltage level on the basis of a difference between the reference voltage and said internal voltage, and causing a current flow between said internal node and a further power supply node in accordance with a result of determination on the voltage level of said internal voltage to adjust the voltage level of the internal voltage to a voltage level defined by said reference voltage.

12. The voltage detection circuitry according to claim 11, wherein
    said voltage level determination circuit includes a detection transistor formed of an insulated gate field effect transistor receiving the voltage of said output node at a gate, said detection transistor selectively turning conductive in accordance with a difference between the reference voltage and said internal voltage, and
    the voltages of the first and second power supply nodes each include, as a voltage component, a voltage corresponding to a threshold voltage of said detection transistor.

13. The voltage detection circuitry according to claim 12, wherein said detection transistor is coupled to said internal node, receiving said internal voltage at a one conduction node thereof and selectively turning conductive in accordance with the difference between the reference voltage and said internal voltage.

14. The voltage detection circuitry according to claim 12, wherein
said voltage level determination circuit further includes at least one voltage dropping element connected between said detection transistor and said output node, and
the voltages of the first and second power supply nodes each include, as a voltage component, a voltage corresponding to a sum of an absolute value of the threshold voltage of said detection transistor and a voltage drop across said voltage dropping element.

15. The voltage detection circuitry according to claim 14, wherein said at least one voltage dropping element includes at least one semiconductor element capable of serving as a diode.

16. The voltage detection circuitry according to claim 11, wherein said voltage level determination circuit outputs a signal indicating a determination result in accordance with a result of determination on a level of said internal voltage.

17. The voltage detection circuitry according to claim 11, wherein
said first power supply node receives a voltage equal to a sum of a first voltage and a difference between said internal voltage and said reference voltage defining said prescribed voltage level, and
said second power supply node receives a voltage equal to a sum of a second voltage and a voltage equal to the difference between said internal voltage and said reference voltage.

18. The voltage detection circuitry according to claim 11, wherein
said first power supply node receives a voltage equal to a subtraction between a first voltage and a difference between said internal voltage and said reference voltage defining said prescribed voltage level, and
said second power supply node receives a voltage equal to a subtraction between a second voltage and the difference between said internal voltage and said reference voltage.

* * * * *